United States Patent
Saeki et al.

(10) Patent No.: US 6,903,975 B2
(45) Date of Patent: Jun. 7, 2005

(54) NONVOLATILE SEMICONDUCTOR MEMORY DEVICE

(75) Inventors: Shunichi Saeki, Ome (JP); Hideakii Kurata, Kokubunji (JP); Naoki Kobayashi, Tokyo (JP)

(73) Assignees: Renesas Technology Corp., Tokyo (JP); Hitachi Device Engineering Co., Ltd., Mobara (JP)

( * ) Notice: Subject to any disclaimer, the term of this patent is extended or adjusted under 35 U.S.C. 154(b) by 0 days.

(21) Appl. No.: 10/786,025

(22) Filed: Feb. 26, 2004

(65) Prior Publication Data

US 2004/0165429 A1 Aug. 26, 2004

Related U.S. Application Data

(63) Continuation of application No. 10/338,018, filed on Jan. 8, 2003, now Pat. No. 6,724,659, which is a division of application No. 10/173,305, filed on Jun. 18, 2002, now Pat. No. 6,525,968, which is a continuation of application No. 09/769,358, filed on Jan. 26, 2001, now Pat. No. 6,414,877.

(30) Foreign Application Priority Data

Jan. 31, 2000 (JP) ...................................... 2000-027341

(51) Int. Cl.⁷ .............................................. G11C 16/00
(52) U.S. Cl. .............................. 365/185.22; 365/185.03
(58) Field of Search ....................... 365/185.22, 185.03, 365/185.18, 185.27, 185.28

(56) References Cited

U.S. PATENT DOCUMENTS

| | | | |
|---|---|---|---|
| 5,321,655 A | 6/1994 | Iwahashi | 365/200 |
| 5,699,296 A | 12/1997 | Song | 365/185.22 |
| 6,009,015 A | 12/1999 | Sugiyama | 365/185.22 |
| 6,282,121 B1 | 8/2001 | Cho et al. | 365/185.22 |
| 6,285,592 B1 | 9/2001 | Kubota | 365/185.22 |
| 6,414,877 B2 | 7/2002 | Saeki et al. | 365/185.22 |
| 6,525,968 B2 * | 2/2003 | Saeki et al. | 365/185.22 |

FOREIGN PATENT DOCUMENTS

EP 0543703 A1 5/1993

* cited by examiner

*Primary Examiner*—Tan T. Nguyen
(74) *Attorney, Agent, or Firm*—Antonelli, Terry, Stout & Kraus, LLP

(57) ABSTRACT

A nonvolatile semiconductor memory device includes a memory cell, formed in a well in a substrate and having a source, a drain, a first gate and a second gate. A word line control circuit drives a word line connected to the second gate, a program data holding circuit holds program data, a programming voltage generator circuit applies a programming voltage onto a bit line connected to the drain, and a discrimination circuit verifies the program data. Programming is conducted by applying positive voltages to the second gate and drain, while injecting hot electrons generated in a channel portion in a vicinity of the drain when 0V is applied to the well and source to increase a threshold voltage. Verification is conducted by applying a verify voltage to the second gate, while applying a positive voltage to the drain and 0V to the well and source, thereby verifying whether the positive voltage applied is maintained or comes down to 0V, depending upon the threshold voltage, by means of the discrimination circuit.

3 Claims, 20 Drawing Sheets

CIRCUIT DIAGRAM

PROGRAMMING BIAS VOLTAGE OF SELECTED MEMORY CELL

PROGRAMMING BIAS VOLTAGE OF UN-SELECTED MEMORY CELL

CURRENT SENSE AMPLIFIER

VOLTAGE SENSE AMPLIFIER

PROGRAMMING BIAS VOLTAGE OF SELECTED MEMORY CELL

PROGRAMMING BIAS VOLTAGE OF UN-SELECTED MEMORY CELL

CIRCUIT DIAGRAM

FLOW-CHART OF PROGRAMMING/VERIFICATION

TWO-LEVEL STORAGE

MULTI-LEVEL (FOUR-LEVEL) STORAGE

NONVOLATILE SEMICONDUCTOR MEMORY DEVICE

CROSS-REFERENCE TO RELATED APPLICATIONS

This is a continuation of application Ser. No. 10/338,018, filed Jan. 8, 2003 now U.S. Pat. No. 6,721,659, which is a divisional of application Ser. No. 10/173,305, filed Jun. 18, 2002 (now U.S. Pat. No. 6,525,968), which is a continuation of application Ser. No. 09/769,358, filed Jan. 26, 2001 (now U.S. Pat. No. 6,414,877), the entire disclosures of which are hereby incorporated by reference.

BACKGROUND OF THE INVENTION

1. Field of the Invention

The present invention relates to a nonvolatile semiconductor device having electric programming/erasing function, and in particular to the nonvolatile semiconductor device, in which discrimination of data information, being written with using injection of hot electron, is made by verifying voltage of a bit line, thereby achieving a high-speed programming/erasing operation.

2. Description of Prior Art

A flush memory, having superior portability and anti-shock property, can be subjected to electric bulk erasing, therefore the needs thereof is spreading out rapidly in recent years, in particular, as a file for personal digital assistances, such as, a mobile personal computer, a digital still camera, etc. For expansion of it on the markets, it is indispensable to have high-speed operation, but with low electric power.

For the purpose of obtaining the high-speed operation, parallel operation is needed, however for realizing the high-speed operation with low electric power, there is a necessity of suppressing the current amount to be as small as possible. An operating method for achieving this is already known as a programming method of utilizing Fowler-Nordheim (FN) type tunneling phenomenon therein.

The programming operation in accordance with this method will be explained by referring to cross section views of memory cells in FIGS. 12A and 12B. A reference numeral 11 in the figures indicates a control gate, 12 a floating gate, 13 a source, 14 a drain, 15 a well, and 16 a substrate, respectively. With this method, for example, the source 13 of a memory cell selected to program is turned to OPEN, while turning the control gate to 17V and the drain 14 to 0V, as shown in the FIG. 12A, so as to inject electron into the floating gate 12 with utilizing the FN type-tunneling phenomenon, thereby performing the programming of data. In this instance, for protecting the memory cell unselected to program from the FN type-tunneling phenomenon occurring therein, unselect voltage of programming, for example, voltage of 5V is applied to the drain 14, as shown in the FIG. 12B.

With this programming method of applying such the FN type-tunneling phenomenon therein, since almost no current flows into each of the memory cells when operating in the programming mode, the high-speed programming operation can be achieved by increasing the number of cells, each of which performs the parallel operation and the programming of data as well, at the same time.

However, since the operation, so-called verification must be done, necessarily after the program operation; i.e., for conduction the verification on the data programmed, the parallel operation is also needed for that verify operation, in order to achieve the high-speed program operation. For performing this verification, there are known methods of using, such as, a current sense amplifier and a voltage sense amplifier therein.

In the method of the current sense amplifier, voltage of 0V is applied to a source line SS of the memory cell, while voltage of 1V is applied to the bit lines BLL and BLR, as shown in FIG. 13A, for example. Further, with applying the verify voltage onto the word line WL, the current Im flowing into the memory cell M and the current Iref flowing into a dummy memory cell DM at that instance are sensed to be compared with to each other in a current sense circuit 19.

On the other hand, in the method of the voltage sense amplifier, with turning the source line SS of the memory cell down to 0V, an internal supply voltage VRPCL to 3V, and a control signal to voltage; i.e., 1V+the threshold voltage of N-type MOS transistors, respectively, voltage of 1V is applied onto the bit line BLL. After that, by turning a signal RPCL to 0V and further applying the verify voltage to the word line WL, the voltage change on the bit line BLL is detected by a voltage sense circuit 21. Namely, when the threshold voltage of the memory cell M is higher than the verify voltage and no current flows therein, the voltage applied onto the bit line BLL does not change, therefore it is decided that the programming is completed, while when the threshold voltage of the memory cell M is lower than the verify voltage and current flows therein, the voltage applied onto the bit line BLL does comes down to 0V, therefore it is decided that the programming is not completed yet.

In any one of the verify methods, though current flows in the memory cell, the current is cut off by turning voltage supply from the internal supply voltage RPCL; i.e., turning the signal RPCL to 0V, in accordance with the method of the voltage sense amplifier, it is possible to operate the memory cell with the low electric power. Accordingly, it can be said that the method of the voltage sense amplifier is advantageous or profitable for obtaining the high-speed through the parallel operation.

From the mentioned above, it has been considered that using the programming method of applying such the FN type-tunneling phenomenon is the best method for realizing the high-speed operation with the low electric power, while making the verification in accordance with the method of the voltage sense amplifier.

However, by the method of programming with applying such the FN type-tunneling phenomenon, it is possible to operate the device with the low electric power, but on the contrary to this, the operation is slow in the data programming, therefore, still there is a limit to achieve the high-speed, if applying the parallel operation thereto.

Then, there is proposed a new cell, being operable with a low electric power through an improvement of programming efficiency, as well as, being fast in the programming operation, by the present inventors, as is described in Japanese Patent Application No. Hei 11-200242 (1999), filed on Jul. 14, 1999.

An outline of the programming operation in this new memory cell will be explained briefly, by referring to FIGS. 14A and 14B. A reference numeral 10 in the figures depicts a third gate; i.e., an assist gate (AG), while 11 the control gate, 12 the floating gate, 13 the source, 14 the drain, 15 the well, 16 the substrate, respectively. This memory cell comprises the third assist gate 10, as shown in the figures, in addition to the structures of the conventional memory cell having the control gate 11 and the floating gate 12.

In the programming operation, as is shown in the FIG. 14A, the programming of data is performed by injecting hot electron generated in the channel area defined between the source 13 and the drain 14m, while turning the source 13 of the selected memory cell for programming to 0V, the assist gate 10 to 2V, the control gate 11 to 12V, the drain 14 to 5V, respectively.

In this instance, for prohibiting the hot electron from generating in the unselected memory cell for programming, the drain 14 is turned to 0V as shown in the FIG. 14B. Since this memory cell has the assist gate 10, as was mentioned previously, when programming, a large electric field is formed in a lower portion of a boundary between the floating gate 12 and the assist gate 10, being wide in the horizontal direction and the vertical direction. With this, an increase is obtained in the generation of the hot electron and the injection efficiency as well; therefore it is possible to achieve the high-speed programming, in spite of the channel current, which is smaller than that in the conventional memory cell. Further, more details thereof will be explained in later, by referring to FIGS. 18 to 21.

SUMMARY OF THE INVENTION

Accordingly, since it is possible to expect the further high-speed and low electric power operation, by using the memory cell having the superior injection efficiency as described in the Japanese Patent Application No. Hei 11-200242 (1999), and further by using the verify method of the voltage sense amplifier, then the present inventors made study on various methods, which will be effective for the verification. However, various problems occur in those methods. Further, the present inventors study the problems that will be mentioned below, first.

As was mentioned previously, 0V is applied to the drain of the selected memory cell for programming while 5V to the drain of the unselected memory cell for programming, in accordance with the programming method of applying the FN type-tunneling phenomenon of the conventional method. On the contrary to this, 5V must be applied to the drain of the selected memory cell for programming while 0V to the drain of the unselected memory cell for programming, in accordance with the programming method by means of the hot electron injection. Due to this, it is impossible to introduce the program/verify circuits as they are, which were applied in the programming method of the FN type-tunneling phenomenon. Next, this will be explained in brief.

By referring to FIGS. 15A and 15B, explanation will be given on an outline of the methods for programming and verifying operations with using the FN type-tunneling phenomenon, on which the present inventors studied. The FIG. 15A shows the circuit diagram of it, and FIG. 15B a flowchart thereof.

First, the programming of data is done. For example, a program select data of 0V or a program unselect data of 3.3V is inputted from an I/O line (I/OL) to a node SLL through a Y gate MOSFET 31 and a Y pre-gate MOSFET 32, so as to turn the supply voltages VSLP and VSLN of the sense amplifier 33 to 5V and 0V, respectively, thereby turning the selected node SLL for programming to 0V while the unselected node SLL for programming to 5V.

Next, the internal supply voltage VPCL is turned to 3.3V, and the signal PCL to 3.3V+the threshold voltage of N type MOS transistors. Due to this operation, the selected bit line BLL for programming, the node SLL of which is turned to 0V, comes down to 0V, and the unselected bit line BLL for programming, the node SLL of which is turned to 5V, to 3.3V, respectively. Herein, further a signal TRL is turned up to 5V+the threshold voltage of N type MOS transistors. Due to this operation, the selected bit line BLL for programming comes down to 0V, while the unselected bit line BLL for programming up to 5V. Under this condition, the word line WL is turned up to 17V at the same time when the source line SS of the memory cell M is tuned into OPEN state. With those operation mentioned above, the FN type-tunneling phenomenon occurs only within the selected cell(s) for programming, so as to program data therein.

Next, the verifying operation is performed. With turning the source line SS of the memory cell down to 0V, while turning the internal supply voltage VRPCL up to 3.3V and the signal RPCL to 1V+the threshold voltage of N type MOS transistors, then 1V is applied to the bit line BLL of the memory cell.

After that, the verify voltage is applied to the word line WL while turning the signal RPCL to 0V at the same time. Due to this operation, the voltage on the bit line BLL is held at 1V if the threshold voltage of the memory cell is higher than the verify voltage and then no current flows therein, on the other hand, it comes down to 0V if the threshold voltage of the memory cell is lower than the verify voltage and current flows therein.

After that, the signal TRL is turned to 3.3V, and then the data on the bit lines BLL are transferred to the output nodes SLL of the sense amplifier 33. Next, with turning the supply voltage VSLP of the sense amplifier 33 up to 3.3V while the voltage VSLN thereof down to 0V, the data on the output nodes SLL of the sense amplifier 33 are amplified to 3.3V and 0V, respectively. Next, under this condition, it is verified that the programming is completed in all the memory cells M.

If all of the nodes SLL are 3.3V, the programming operation is finished. When any one of the nodes SLL is 0V, preparation is made for the programming operation of a second time. Namely, with turning the supply voltage VSLP of the sense amplifier 33 up to 5V while the voltage VSLN thereof down to 0V, the voltages at the output nodes of the above-mentioned sense amplifier 33 are further amplified from 3.3V and 0V to 5V and 0V, respectively.

Due to this operation, the voltage at the node SLL comes to 5V when the threshold voltage of the memory cell M is higher than the verify voltage and then the programming is fully done, and while the voltage at the node SLL comes to 0V when the threshold voltage of the memory cell M is lower than the verify voltage and the programming is done insufficiently.

At the end, if the signal TRL is turned to 7V under this condition, the unselected signal for programming, such as 5V, is applied onto the bit lines BLL of the memory cells, each of which is programmed up to a desired threshold value by the programming of the first time, but the selected signal for programming of 0V is applied onto the bit lines BLL of the memory cells, in each of which the programming is done insufficiently.

The mentioned above is an outline of the operations of programming and verification with using the FN type-tunneling phenomenon.

On a while, an example of a flowchart is shown in FIG. 16, for such the operations of programming and verification through the hot electron injection, as was proposed by the Japanese Patent Application No. Hei 11-200242 (1999).

In the operation of programming through the hot electron injection, 5V must be applied to the drain of the selected memory cell for programming, while 0V to that of the unselected memory cell for programming, as shown in the FIGS. 14A and 14B. Namely, since the voltages being applied to the bit lines in the programming operation are turned over or reversed, it is impossible to adapt the circuit operation shown in the FIG. 15A, as it is.

An object of the present invention, therefore, is to provide a nonvolatile semiconductor device, performing the programming operation through the hot electron injection, and being applicable with the verify method of the voltage sense amplifier as well, thereby enabling a high-speed operation with low electric power.

With the nonvolatile semiconductor device, according to the present invention, the data is programmed through the hot electron injection into the floating gate, and the device comprises a voltage sense circuit for detecting or determining the voltage which is applied to the bit line is changed or not, depending upon the threshold voltage of the memory cell, for the purpose of the verification of the data programmed.

In particular, with the nonvolatile semiconductor device, in which such the third assist gate is provided as described in the Japanese Patent Application No. Hei 11-200242 (1999), the method of the voltage sense amplified is applied, so as to use also the third gate effectively, when verifying the data programming condition after completion of the data programming operation through the hot electron injection into the floating gate, thereby performing the verification effectively and with certainty.

For example, when verifying the programming of data, a verify voltage is applied to the control gate in the upper portion of the floating gate, which is smaller than the voltage when programming, while applying the voltage larger than that to the third gate, thereby enabling the verification effectively and with certainty.

Also, according to a representative one of the embodiments according to the present invention, between the output node of the verify circuit constructed with the sense amplifier of a flip-flop type and the bit line of the memory cell, there are connected a MOSFET for connecting between them and a converter circuit formed with a plural number of MOSFETs for converting and transferring the data which is verified by means of the verify circuit to the bit line, so as to invert the data verified at least one time, for example, thereby enabling the continuous programming operation into the memory cells, with which the programming is not yet completed sufficiently.

DETAILED DESCRIPTION OF PREFERRED EMBODIMENTS

Figure 1:
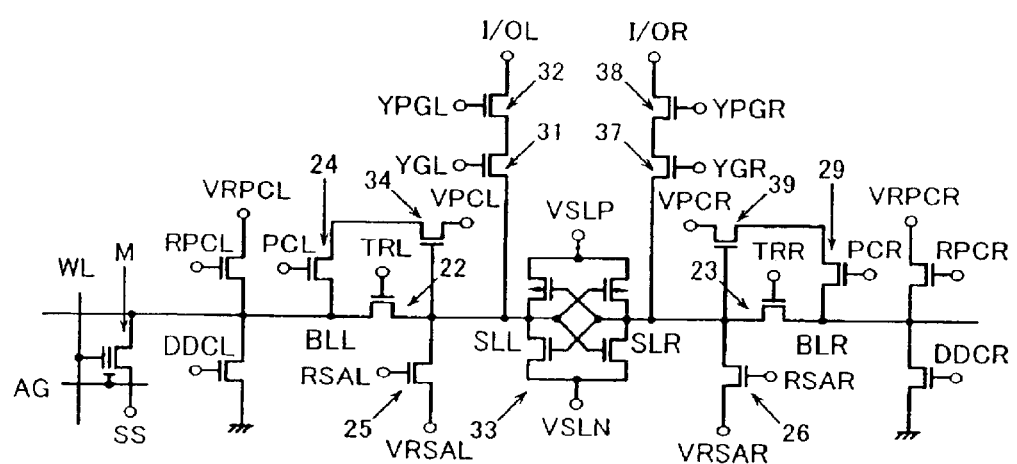
FIG. 1 is a circuit diagram for programming/verifying operation for embodiments 1 and 2, according to the present invention.

Hereinafter, embodiments according to the present invention will be fully explained by referring to the attached drawings. However, in all of the drawings for explaining those embodiments, every element having the same function is given with the same reference numeral or mark, and repetitive explanation thereof is omitted therefrom. Also, bit lines as the object of the programming and verifying operations are indicated by BLL, while those at a reference side by BLR. Further, in FIGS. 2, 3, 5, 6, 9, and 11 for showing timing sequences, it is assumed that a low voltage means 0V and a high voltage 3.3V, respectively. Furthermore, explanation will be given by assuming the threshold voltage of the N-type MOS transistors to be 1V. However, those voltage values, which will be given in the following explanation, are only for the explanatory purpose, therefore there is no necessity that they should be restricted only to those.

<Embodiment 1>

Figure 2:
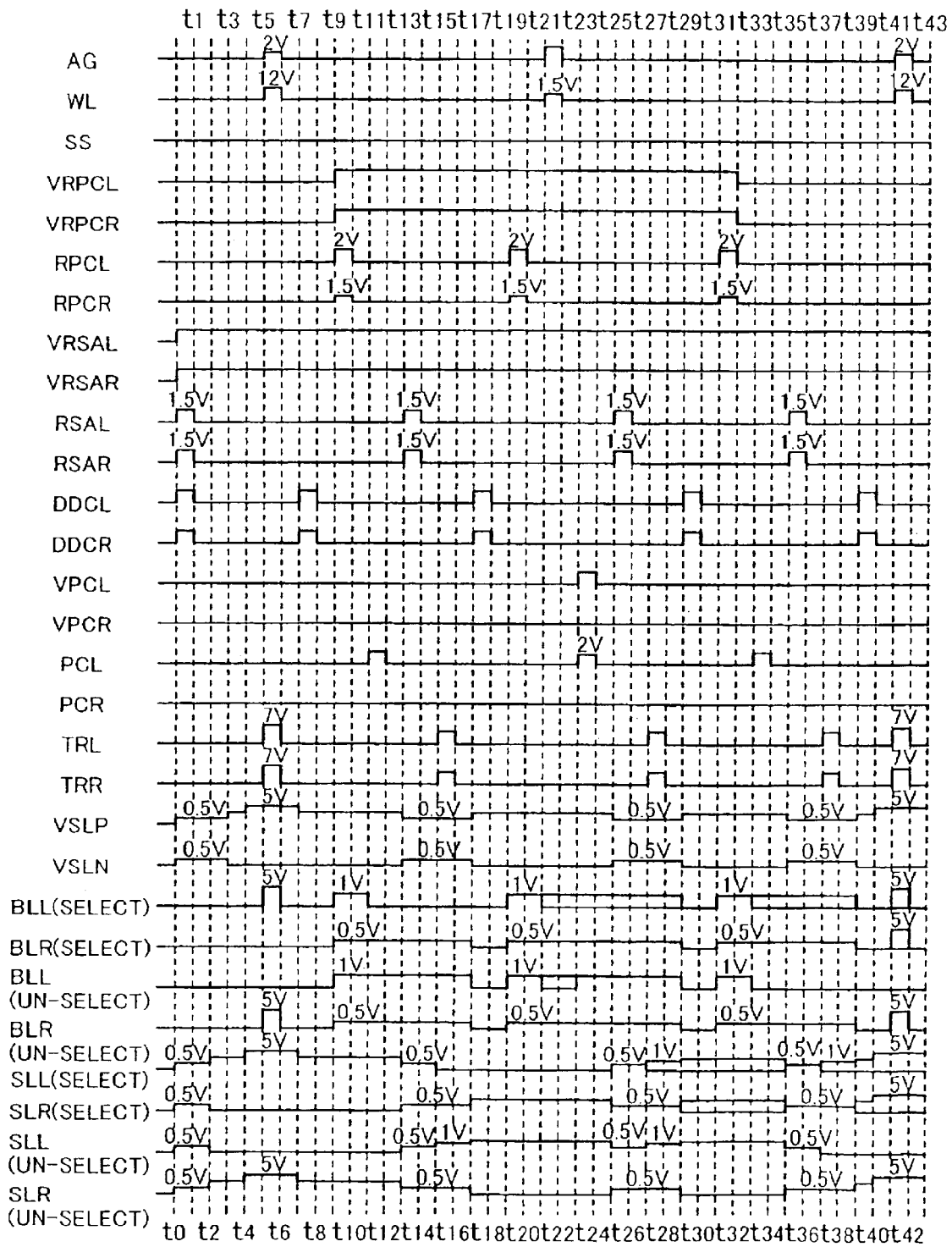
FIG. 2 is a time sequence for the verifying operation in the embodiment 1, according to the present invention.

First of all, explanation will be given on a first embodiment according to the present invention, by referring to FIGS. 1 and 2. The FIG. 1 shows circuit diagram of the circuit being necessary for the programming/verifying operation onto the memory cell, which is explained with reference to the FIGS. 14A and 14B, and the FIG. 2 the time sequence for the verify operation thereof.

First, the following programming/verifying operation is performed after verifying that the programming is completed or not, for all the memory cells.

At first, at timing t0, internal supply voltages VRSAL and VRSAR are turned to 0.5V, control signals RSAL and RSAR to 1.5V; i.e., 1V+the threshold voltage of N-type MOS transistors, and the voltages DDCL and DDCR to 3.3V, respectively. Due to this, the output nodes SLL and SLR of a sense amplifier 33 are set at 0.5V, while the bit lines BLL and BLR at 0V, irrespective of selected or unselected condition thereof. Next, at timing t1, the control voltages RSAL, RSAR, DCCL and DCCR are tuned to 0V, thereby completing the setting of the output nodes SLL and SLR and the bit lines BLL and BLR of the sense amplifier 33.

Next, at timing t2, through the MOSFETs 31, 32, 37 and 38, various voltages are inputted from an I/O line (such as, I/OL and I/OR); i.e., 3.3V to the selected node SLL for programming, 0V to the selected reference node SLR for programming, 0V to the unselected node SLL for programming, and 3.3V to the unselected reference node SLR for programming, respectively, by applying voltages (not shown in the FIG. 2 for simplification) to Y gates (YGL and YGR) and Y pre-gates (YPGL and YPGR).

Next, at timing t3, the internal supply voltages VSLP and VSLN are turned to 3.3V and 0V, respectively, thereby amplifying the data on the output nodes SLL and SLR of the sense amplifier 33. With this, the selected node SLL for programming comes to 3.3V, the selected reference node SLR for programming to 0V, the unselected node SLL for programming to 0V, and the unselected reference node SLR for programming to 3.3V, respectively.

Next, at timing t4, the internal supply voltages VSLP and VSLN are turned to 5V and 0V, respectively, thereby amplifying the data on the output nodes SLL and SLR of the sense amplifier 33, so as to prepare for the programming operation of data. With this, the selected node SLL for programming comes to 5V, the selected reference node SLR for programming to 0V, the unselected node SLL for programming to 0V, and the unselected reference node SLR for programming to 5V, respectively.

Next, at timing t5, voltages are applied; i.e., 2V to the assist gate AG (i.e., corresponding to the third gate 10 in the FIGS. 14A and 14B) and 12V to the word line WL, respectively. In this instance, the control signals TRL and TRR are turned to voltage, for example 7V, so that the NMOS is turned ON fully, so as to apply a programming voltage of 5V onto the bit line BLL. With this, 5V is applied to the selected bit line BLL for programming, 0V to the selected reference bit line BLR for programming, 0V to the unselected bit line BLL for programming, and 5V to the unselected reference bit line BLR for programming, therefore the data are programmed only into the memories selected for programming. Next, at timing t6, the assist gate AG, the word line WL, the control lines TRL and TRR are tuned to 0V, thereby completing the programming.

Next, at timing t7, both the control signals DDCL and DDCR are turned to 3.3V, while the bit lines BLL and BLR are reset to 0V. Also, at the same time, the internal supply voltage VSLP is turned to 3.3V. With this, the selected node SLL for programming comes to 3.3V, the selected reference node SLR for programming comes to 0V, the unselected node SLL for programming comes to 0V, and the selected reference node SLR for programming comes to 3.3V, respectively. Next, at timing t8, the control signals DDCL and DDCR are turned to 0V, thereby cutting off the supply of the voltage of 0V to the bit lines BLL and BLR.

Next, during the time period from timing t9 to t17, the data on the output node SLL of the sense amplifier are inverted.

First, at timing t9, the internal voltage supplies VRPCL and VRPCR are turned to 3.3V, while the control signals RPCL and RPCR are tuned to 2V; i.e., 1V+the threshold voltage of N-type MOS transistors, and to 1.5V; i.e., 0.5V+ the threshold voltage of N-type MOS transistors, respectively. With this, all the bit lines BLL are pre-charged up to 1V, and the reference bit lines BLR to 0.5V. Next, at timing t10, the control signals RPCL and RPCR are turned to 0V, thereby cutting off the supply of pre-charge voltage.

Next, at timing t11, the control signal PCL is turned to 3.3V. In this instance, the internal supply voltage is 0V. Due to this, only the bit line BLL when the output node SLL of the sense amplifier 33 is 3.3V is changed from 1V to 0V. With this, the selected bit line BLL for programming comes to 0V, while the unselected bit line for programming to 1V. In this instance, the reference bit line BLR is held at 0.5V irrespective of the selected or unselected condition thereof. Next, at timing t12, the control signal PCL is turned to 0V, thereby cutting off the output node SLL of the sense amplifier 33 and the bit line BLL.

Next, at timing t13, the internal supply voltages VSLP and VSLN are turned to 0.5V, while the control signals RSAL and RSAR to 1.5V; i.e., 0.5V+the threshold voltage of the N-type MOS transistors. with this, the output nodes SLL and SLR of the sense amplifier 33 are set to 0.5V irrespective of the selected or unselected condition thereof. Next, at timing t14, the control signals RSAL and RSAR are tuned to 0V, thereby cutting of the supply of 0.5V to the output nodes SLL and SLR of the sense amplifier.

Next, at timing t15, the control signals TRL and TRR are turned to 3.3V, and the data on the bit lines are transferred to the output nodes of the sense amplifier 33. With this, the output node SLL of the selected sense amplifier 33 for programming comes to 0V, the selected reference node SLR for programming to 0.5V, the unselected output node SLL for programming to 1V, and the unselected reference node SLR for programming to 0.5V, respectively. Next, at timing t16, the control signals TRL and TRR are tuned to 0V, thereby cutting off the bit lines and the output nodes of the sense amplifier.

Next, at timing t17, with turning the internal supply voltages VSLP and VSLN to 3.3V and 0V, respectively, the data on the output nodes SLL and SLR of the sense amplifier 33 are amplified. With this, the selected node SLL for programming comes to 0V, the selected reference node SLR for programming to 3.3V, the unselected node SLL for programming to 3.3V, and the unselected reference node SLR for programming to 0V, respectively. Also, at the same time of this, the control signals DDCL and DDCR are tuned to 3.3V, while the bit lines BLL and BLR are reset to 0V.

Due to the above operations from the timing t9 to the timing t17, the data on the output nodes SLL and SLR are inverted. Next, at timing t18, the control signals DDCL and DDCR are tuned to 0V, thereby cutting off the supply of 0V to the bit lines BLL and BLR.

Next, at timing t19, the control signals RPCL and RPCR are turned to 2V; i.e., 1V+the threshold voltage of the N-type MOS transistors, and to 1.5V; i.e., 0.5V+the threshold voltage of the N-type MOS transistors, respectively. With this, all the bit lines BLL are pre-charged up to 1V, while the reference bit lines BLR to 0.5V. Next, at timing t20, the control signals RPCL and RPCR are tuned to 0V, thereby cutting off the supply of the pre-charge voltage.

Next, at timing 21, a verify voltage; i.e., 1.5V, being smaller than the voltage 12V when programming, is applied onto the word line WL of the memory cell M, while applying 3.3V, being larger than 2V when programming, onto the assist gate AG, and then a memory discharge operation is performed. In this instance, since the voltage of 1V is pre-charged onto the bit line BLL of the memory cell M, no current flows in the memory cell, if the threshold voltage of the memory cell M is higher than the verify voltage of 1.5V and if the programming condition therein is sufficient. Due to this, the voltage on the bit line BLL is kept at 1V. On a while, if the threshold voltage of the memory cell M is lower than the verify voltage of 1.5V and if the programming condition therein is insufficient, current flows in the memory cell. Due to this, the voltage on the bit line BLL is discharged down to 0V. In this instance, the reference bit line BLR is kept at 0.5 irrespective of the selected or the unselected condition for programming. Next, at timing t22, the word line WL of the memory cell and the assist gate AG are turned to 0V, thereby completing the memory discharge.

Next, at timing t23, the internal supply voltage VPCL is turned to 3.3V, while the control signal PCL to 2V; i.e., 1V+the threshold voltage of the N-type MOS semiconductors. With this, only the bit line BLL when the data on the output node SLL of the sense amplifier 33 is 0V is changed from 0V to 1V. Due to this, the selected bit line BLL for programming is kept at the result of the memory discharge mentioned above as it is, and the unselected bit line BLL for programming comes to 1V irrespective of the result of the memory discharge mentioned above. In this instance, the reference bit line BLR is held at 0.5V irrespective of the selected or the unselected condition for programming. Next, at timing t24, the internal supply voltage VPCL and the control voltage PCL are turned to 0V, thereby cutting off the output node SLL of the sense amplifier 33 and the bit line BLL.

Next, at timing t25, the internal supply voltages VSLP and VSLN are turned to 0.5V, while the control signals RSAL and RSAR to 1.5V; i.e., 0.5V+the threshold voltage of the N-type MOS transistors. With this, the output nodes SLL and SLR of the sense amplifier 33 are set to 0.5V irrespective of the selected or the unselected condition thereof for programming. Next, at timing t26, the control signals RSAL and RSAR are turned to 0V, thereby cutting off the supply of 0.5V to the output nodes SLL and SLR of the sense amplifier 33.

Next, at timing t27, the control signals TRL and TRR are turned to 3.3V, while the data on the bit line are transferred to the output nodes of the sense amplifier. With this, as the result of the memory discharge operation mentioned above, the output node SLL of the selected sense amplifier for programming comes to 1V, when the bit line BLL is held at 1V, namely when the programming therein is sufficient, while it comes to 0V when the bit line BLL is discharged down to 0V, namely when the programming is insufficient. Also, since the unselected bit line BLL for programming is 1V irrespective of the result of the memory discharge, the output node SLL of the sense amplifier 33 come to 1V irrespective of the result of that memory discharge. Also, the reference output node SLR of the sense amplifier comes to 0.5V irrespective of the selected or the unselected condition thereof for programming. Next, at timing t28, the control signals TRL and TRR are turned to 0V. With this, the bit line and the output node of the sense amplifier 33 are cut off.

Next, at timing t29, the internal supply voltage VSLP and VSLN are tuned to 3.3V and 0V, respectively, and the data on the output nodes SLL and SLR of the sense amplifier are amplified. With this, the output nodes of the selected sense amplifier 33 for programming depend upon the result of the memory discharge operation; i.e., the output node SLL comes to 3.3V and the reference node to 0V when the programming is sufficient, while the output node SLL comes to 0V and the reference node to 3.3V when the programming is in sufficient. Also, regardless of the result of the memory discharge mentioned above, the output nodes of the unselected sense amplifier 33 for programming come to as follows; i.e., the output node SLL to 3.3V and the reference node SLR to 0V, respectively. Further, at the same time of this, the control signals DDCL and DDCR are tuned to 3.3V, and the bit lines BLL and BLR are reset to 0V. Next, at timing t30, the control signals DDCL and DDCR are turned to 0V, thereby cutting of the supply of 0V to the bit lines BLL and BLR.

Next, due to the operations from timing t31 to timing t39, the data on the output node SLL of the sense amplifier are inverted.

First, at timing t31, the control signals RPCL and RPCR are turned to 2V; i.e., 1V+the threshold voltage of the N-type MOS transistors, and to 1.5V; i.e., 0.5V+the threshold voltage of the N-type MOS transistors, respectively. With this, all the bit lines BLL are pre-charged up to 1V, while the reference bit lines BLR to 0.5V, respectively, regardless of the selected or the unselected condition thereof for programming. Next, at timing t32, the internal supply voltages VRPCL and VRPCR and the control signals RPCL and RPCR are tuned to 0V, thereby cutting off the supply of the pre-charge voltage.

Next, at timing t33, the control signals PCL is turned to 3.3V. In this instance, the internal supply voltage VPCL is 0V. With this, only the bit line BLL when the output node SLL of the sense amplifier 33 is 3.3V is change from 1V to 0V. Due to this, the selected bit line BLL for programming, as a result of the memory discharge operation mentioned above, comes to 0V when the programming is sufficient, while to 1V when the programming is insufficient, however the unselected bit line BLL comes to 0V irrespective of the result of the memory discharge operation mentioned above. Also, the reference bit line BLR is held at 0.5V irrespective of the selected or the unselected condition thereof for programming. Next, at timing t34, the control signal PCL is turned to 0V, thereby cutting off the output node SLL of the sense amplifier 33 and the bit line BLL.

Next, at timing t35, the internal supply voltages VSLP and VSLN are turned to 0.5V, and the control signals RSAL and RSAR to 1.5V; i.e., 0.5V+the threshold voltage of the N-type MOS transistors, respectively. With this, the output node SLL of the sense amplifier 33 is set to 0.5V irrespective of the selected or unselected condition thereof for programming. Next, at timing t36, the control signals RSAL and RSAR are turned to 0V, thereby cutting off the supply of 0.5V to the output nodes SLL and SLR of the sense amplifier 33.

Next, at timing 37, the control signals TRL and TRR are turned to 3.3V, thereby transferring the data on the bit line to the output nodes of the sense amplifier 33. With this, the output node SLL of the selected sense amplifier 33 for programming, as the result of the memory discharge operation mentioned above, comes to 0V when the programming is sufficient, while to 1V when it is insufficient. Also, since the unselected bit line BLL for programming comes to 0V irrespective of the result of the memory discharge, the output node SLL of the unselected sense amplifier 33 for programming comes to 0V irrespective of the result of the memory discharge. Also, the output node SLR of the sense amplifier at the side of reference comes to 0.5V irrespective of the selected or the unselected condition thereof for programming. Next, at timing t38, the control signals TRL and TRR are turned to 0V. With this, the bit lines and the output nodes of the sense amplifier 33 are cut off.

Next, at timing t39, the internal supply voltages VSLP and VSLN are turned to 3.3V and 0V, respectively, so as to amplify the data on the output nodes SLL and SLR of the sense amplifier 33. With this, the output nodes of the selected sense amplifier for programming depend upon the result of the memory discharge operation mentioned above; i.e., the output node SLL comes to 0V while the reference node SLR to 3.3V when the programming is sufficient, however the output node SLL comes to 3.3V while the reference node SLR to 0V when the programming is insufficient. Also, the output nodes of the unselected sense amplifier 33 for programming come to be irrespective of the memory discharge operation mentioned above; i.e., the output node SLL comes to 0V while the reference node SLR to 3.3V. Further, at the same time of this, the control signals DDCL and DDCR are turned to 3.3V, and the bit lines BLL and BLR are reset to 0V.

With the operations from the timing t31 to the timing t39 mentioned above, the data on the output nodes SLL and SLR of the sense amplifier 33 are inverted. Next, at timing t40, the control signals DDCL and DDCR are turned to 0V, thereby cutting off the supply of 0V to the bit lines BLL and BLR. Also, at the same time, the internal supply voltages VSLP and VSLN are turned to 5V and 0V, respectively, the data on the output nodes SLL and SLR of the sense amplifier are amplified for preparation of the programming thereof. With this, the output nodes of the selected sense amplifier 33 for programming depend upon the result of the memory discharge operation mentioned above; i.e., the output node SLL comes to 0V and the reference node SLR to 5V, if the programming is sufficient, while the SLL to 5V and the reference node SLR to 0V, if the programming is insufficient. Also, the output nodes of the unselected sense amplifier 33 come to as follows; i.e., the SLL to 0V and the reference node SLR to 5V irrespective of the result of the memory discharge operation mentioned above.

Next, at timing t41, 2V is applied to the assist gate AG while 12V to the word line WL. In this instance, the control signals TRL and TRR are tuned to such the voltage, for example 7V, so that the NMOS is fully turned ON, so as to apply the programming voltage of 5V to the bit line BLL with certainty. With this, the selected bit lines for programming depend upon the result of the memory discharge operation mentioned above; i.e., the BLL comes to 0V and the reference BLR to 5V when the programming is sufficient, while the BLL comes to 5V and the reference BLR to 0V when the programming is insufficient. Also, the unselected bit lines for programming come to as follows; i.e., the BLL to 0V and the reference bit line BLR to 5V irrespective of the memory discharge operation mentioned above. Namely, in the selected memory cells for programming, the voltage of 5V is applied only onto the bit line BLL of the memory cell(s), in which the programming is insufficient in the first programming operation, so as to be performed with the programming operation again therein. Next, at timing t42, the assist gate AG, the word line WL, the control signals TRL and TRR are turned to 0V, thereby completing the programming.

After that, verification is made on whether the programming is completed for all of the memory cells or not, and the verify operation is ended if it is decided to be completed, while the operations from the timing t7 to the timing t43 are repeated if not.

Figure 15A:
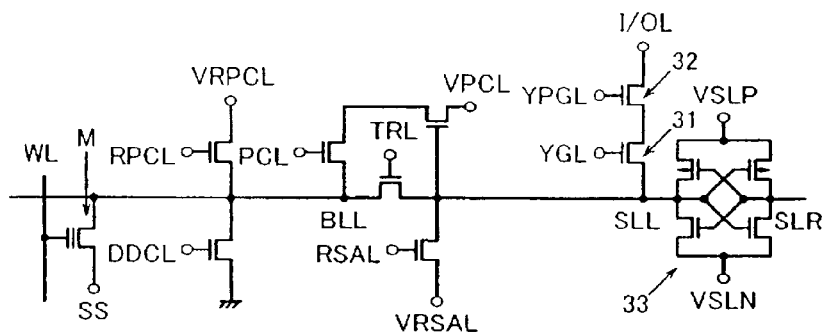
FIGS. 15A and 15B are a circuit diagram and a flowchart for explanation of the programming/verifying operation through the FN type-tunneling phenomenon.
Figure 15B:
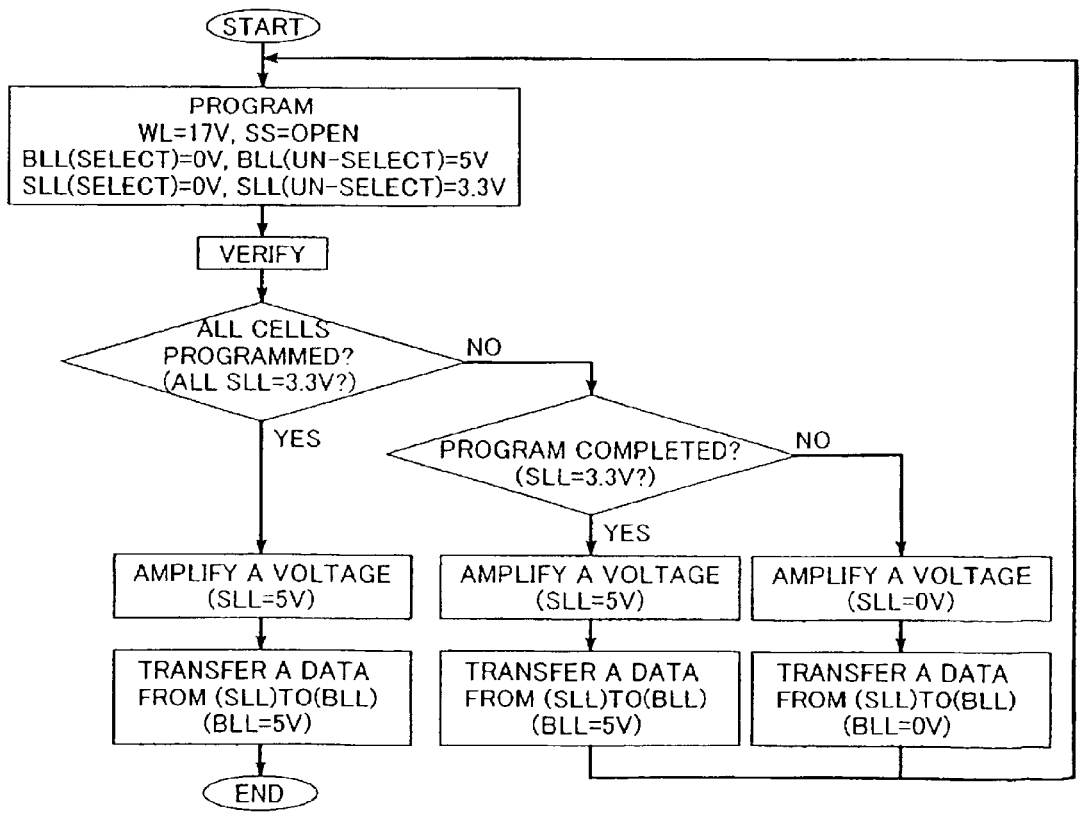
Figure 16:
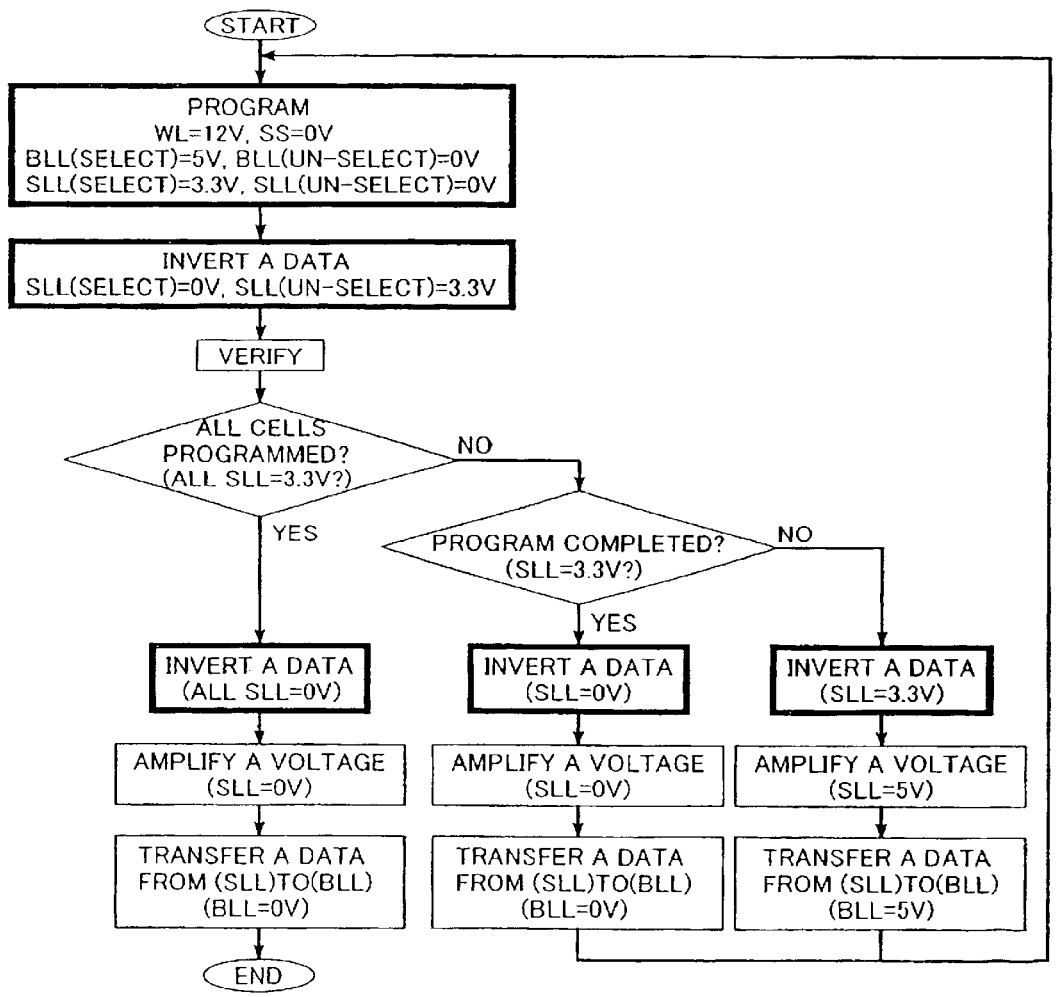
FIG. 16 is a flowchart, for explanation of the programming operation through the hot electron injection.

The above-mentioned is about the programming/verifying operation in the embodiment 1. According to the present embodiment, it is possible to use the circuit constructions shown in the FIG. 15A as they are, but without any change in the circuitry thereof.

In the present embodiment 1, each of N-type MOSFETs 22 and 23 has the sense amplifier; namely a kind of switching function for connecting the output node (corresponding to SLL or SLR) of the verify circuit 33 of the flip-flop type and the bit line (BLL or BLR), in series. Also, N-type MOSFETs 24 and 34 and N-type MOSFETs 29 and 39, which are connected in series between the source and the drain thereof, are connected between the bit line BLL and the internal supply voltage VPCL and between the BLR and the internal supply voltage VPCR, respectively; the gates of the MOSFETs 24 and 29 are connected to the signal lines PCL and PCR, respectively; and the gates the MOSFETs 34 and 39 are connected to the output nodes SLL and SLR of the sense amplifier (a verify circuit of the flip-flop type) 33, respectively, wherein those transistors groups perform the functions of converting the data verified by the sense amplifier 33, thereby to transfer them onto the bit lines BLL and BLR, effectively.

Also, since all of the parts, but except for the sense amplifier 33, are be constructed with the NMOS transistors, it is possible to suppress the well isolation areas defined between NMOS transistor and PMOS transistor to be small, thereby obtaining small-sizing of the layout area thereof.

Also, the third gate, as the assist gate of the memory cell M, can be used effectively, not only when programming the data, but also when verifying them, and in particular, the voltage being larger than that of when programming (the voltage being larger in the absolute value) is applied when verifying them, therefore, it is possible to verify the programming condition, effectively and with certainty.

<Embodiment 2>

Figure 3:
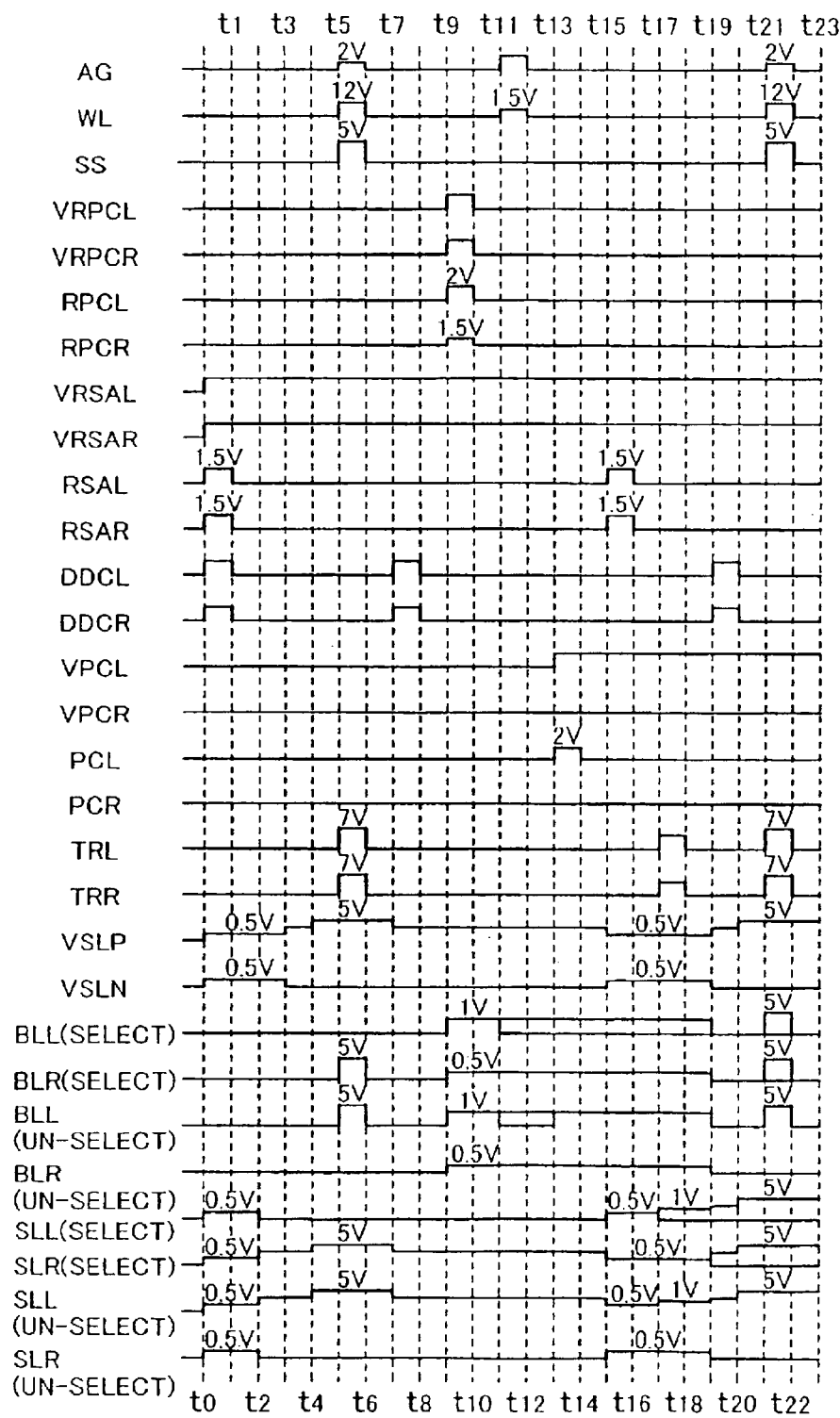
FIG. 3 is a time sequence for the verifying operation in the embodiment 2, according to the present invention.

Next, explanation will be given on a second embodiment according to the present invention, by referring to FIGS. 1 and 3. The FIG. 1 shows the circuit diagram necessary for the programming/verifying operation, as was mentioned previously, and the FIG. 3 shows a time sequence for the verify operation thereof.

Figure 14A:
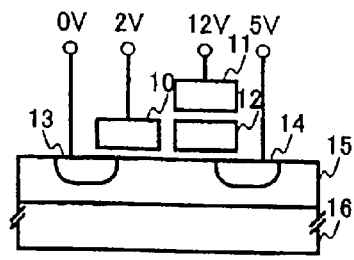
FIGS. 14A and 14B are the cross-section views of an essential portion of the memory cell, for showing the programming operation through hot electron injection.
Figure 14B:
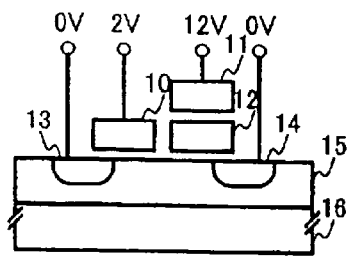

The present embodiment 2 applies the cells of the hot-electron injection type as the memory cells, which was explained in the FIGS. 14A and 14B, and in a method thereof, the programming voltage, although being applied from the drain in the above-mentioned embodiment 1, is applied from the source. Namely, the programming voltage is applied to the selected memory M for programming at the source thereof, while the drain is turned to 0V. In this instance, since the programming voltage is applied to the source of the unselected memory cell for programming, the programming obstruction voltage, which has the same voltage to that of the programming voltage, is applied to the drain, thereby preventing it from the programming-therein.

Although detailed operations will be omitted here, after verifying that the programming is completed for all of the memory cells at first, the programming/verifying operation will be performed as mentioned below.

First of all, at timing t0, the internal source voltages VRSAL and VRSAR are turned to 3.3V, VSLP and VSLN to 0.5V, the control signals RSAL and RSAR to 1.5V; i.e., 1V+the threshold voltage of the N-type MOS transistors, and DDCL and DDCR to 3.3V, respectively. With this, the output nodes SLL and SLR of the sense amplifier are set to 0.5V, while the bit lines BLL and BLR to 0V, irrespective of the selected or the unselected condition thereof. Next, at timing t1, the control signals RSAL, RSAR, DDCL and DDCR are turned to 0V, thereby completing the setting operation for the output nodes SLL and SLR of the sense amplifier and the bit lines BLL and BLR.

Next, at timing t2, through the MOSFETs 31, 32, 37 and 38, various voltages are inputted from an I/O line (such as, I/OL and I/OR); i.e., 0V to the selected node SLL for programming, 3.3V to the selected reference node SLR for programming, 3.3V to the unselected node SLL for programming, and 0V to the unselected reference node SLR for programming, respectively, by applying voltages to Y gates (YGL and YGR) and Y pre-gates (YPGL and YPGR).

Next, at timing t3, the internal supply voltages VSLP and VSLN are turned to 3.3V and 0V, respectively, thereby amplifying the data on the output nodes SLL and SLR of the sense amplifier 33. With this, the selected node SLL for programming comes to 0V, the selected reference node SLR for programming to 3.3V, the unselected node SLL for programming to 3.3V, and the unselected reference node SLR for programming to 0V, respectively.

Next, at timing t4, the internal supply voltages VSLP and VSLN are turned to 5V and 0V, respectively, the data on the output nodes SLL and SLR of the sense amplifier 33 are amplified, so as to prepare for the programming operation thereof. With this, the selected node SLL for programming comes to 0V, the selected reference node SLR for programming to 5V, the unselected node SLL for programming to 5V, and the unselected reference node SLR for programming to 0V, respectively.

Next, at timing t5, voltages are applied; i.e., 2V to the assist gate AG.(i.e., the third gate 10 in the FIGS. 14A and 14B), 12V to the word line WL, and 5V to the source line SS, respectively. In this instance, the control signals TRL and TRR are turned to such the voltage, for example 7V, so that the NMOS is turned ON fully, to apply a programming voltage of 5V onto the bit line BLL with certainty. With this, 0V is applied to the selected bit line BLL for programming, 5V to the selected reference bit line BLR for programming, 5V to the unselected bit line BLL for programming, and 0V to the unselected reference bit line BLR for programming, respectively, therefore the data are programmed only into the memories selected for programming. Next, at timing t6, the assist gate AG, the word line WL, the control lines TRL and TRR are tuned to 0V, thereby completing the programming.

Next, at timing t7, both the control signals DDCL and DDCR are turned to 3.3V, while the bit lines BLL and BLR are reset to 0V. Also, at the same time of this, the internal supply voltage VSLP is turned to 3.3V. With this, the selected node SLL for programming comes to 0V, the selected reference node SLR for programming comes to 3.3V, the unselected node SLL for programming comes to 3.3V, and the selected reference node SLR for programming comes to 0V, respectively. Next, at timing t8, the control signals DDCL and DDCR are turned to 0V, thereby cutting off the supply of voltage of 0V to the bit lines BLL and BLR.

Next, at timing t9, the internal supply voltages RPCL and RPCR are turned to 2V; i.e., 1V+the threshold voltage of the N-type MOS transistors, and 1.5V; 0.5V+the threshold voltage of the N-type MOS transistors, respectively,. With this, all the bit lines BLL are pre-charged up to 1V, and the reference bit lines BLR to 0.5V. Next, at timing t10, the control signals RPCL and RPCR are turned to 0V, thereby cutting off the supply of pre-charge voltage.

Next, at timing t11, a verify voltage; such as 1.5V, being smaller than the voltage 12V when programming, is applied onto the word line WL of the memory cell M, while applying 3.3V, being larger than 2V when programming, onto the assist gate AG, then the memory discharge operation is performed. In this instance, since the voltage of 1V is pre-charged onto the bit line BLL of the memory cell M, no current flows in the memory cell, if the threshold voltage of the memory cell M is higher than the verify voltage of 1.5V and if the programming condition therein is sufficient. Due to this, the voltage on the bit line BLL is kept at 1V. On a while, if the threshold voltage of the memory cell M is lower than the verify voltage of 1.5V and if the programming condition therein is insufficient, current flows in the memory cell. Due to this, the voltage on the bit line BLL is discharged down to 0V. In this instance, the reference bit line BLR is kept at 0.5 irrespective of the selected or the unselected condition thereof for programming. Next, at timing t12, the word line WL of the memory cell and the assist gate AG are turned to 0V, thereby completing the memory discharge.

Next, at timing t13, the internal supply voltage VPCL is turned to 3.3V, while the control signal PCL to 2V; i.e., 1V+the threshold voltage of the N-type MOS semiconductors. With this, only the bit line BLL when the data on the output node SLL of the sense amplifier 33 is 3.3V is changed from 0V to 1V. Due to this, the selected bit line BLL for programming is kept at the result of the memory discharge mentioned above as it is, and the unselected bit line BLL for programming comes to 1V irrespective of the result of the memory discharge mentioned above. In this instance, the reference bit line BLR is held at 0.5V irrespective of the selected or the unselected condition thereof for programming. Next, at timing t14, the internal supply voltage VPCL and the control voltage PCL are turned to 0V, thereby cutting off the output node SLL of the sense amplifier 33 and the bit line BLL.

Next, at timing t15, the internal supply voltages VSLP and VSLN are turned to 0.5V, while the control signals RSAL and RSAR to 1.5V; i.e., 0.5V+the threshold voltage of the N-type MOS transistors. With this, the output nodes SLL and SLR of the sense amplifier 33 are set to 0.5V irrespective of the selected or the unselected condition thereof for programming. Next, at timing t16, the control signals RSAL and RSAR are turned to 0V, thereby cutting off the supply of 0.5V to the output nodes SLL and SLR of the sense amplifier 33.

Next, at timing t17, the control signals TRL and TRR are turned to 3.3V, thereby transferring the data on the bit line to the output node of the sense amplifier 33. With this, as the result of the memory discharge operation mentioned above, the output node SLL of the selected sense amplifier 33 for programming comes to 1V, when the bit line BLL is held at 1V, namely when the programming therein is sufficient, while it comes to 0V when the bit line BLL is discharged down to 0V, namely when the programming is insufficient. Also, since the unselected bit line BLL for programming is 1V irrespective of the result of the memory discharge, the output node SLL of the sense amplifier 33 comes to 1V irrespective of the result of that memory discharge. Also, the output node SLR at the side of reference of the sense amplifier comes to 0.5V irrespective of the selected or the unselected condition thereof for programming. Next, at timing t18, the control signals TRL and TRR are turned to 0V. Due to this, the bit lines and the output nodes of the sense amplifier are cut off.

Next, at timing t19, the internal supply voltage VSLP and VSLN are tuned to 3.3V and 0V, respectively, and the data on the output nodes SLL and SLR of the sense amplifier 33 are amplified. With this, the output nodes of the selected sense amplifier 33 for programming depend upon the result of the memory discharge operation; i.e., the output node SLL to 3.3V and the reference node to 0V when the programming is sufficient, while the output node SLL to 0V and the reference node to 3.3V when the programming is insufficient. Also, regardless of the result of the memory discharge mentioned above, the output nodes of the unselected sense amplifier 33 for programming come to as follows; i.e., the output node SLL to 3.3V and the reference node SLR to 0V, respectively. Further, at the same time of this, the control signals DDCL and DDCR are tuned to 3.3V, and the bit lines BLL and BLR are reset to 0V, respectively. Next, at timing t20, the control signals DDCL and DDCR are turned to 0V, thereby cutting off the supply of 0V to the bit lines BLL and BLR. Also, at the same time of this, the internal supply voltages VSLP and VSLN are turned to 5V and 0V, respectively, then the data on the output nodes SLL and SLR of the sense amplifier 33 are amplified for preparation of the programming therein. With this, the output nodes of the selected sense amplifier 33 for programming depend on the result of the memory discharge operation mentioned above; i.e., the output node SLL comes to 5V and the reference node SLR to 0V, if the programming is sufficient, while the SLL to 0V and the reference node SLR to 5V, if the programming is insufficient. Also, the output nodes of the unselected sense amplifier 33 come to as follows; i.e., the SLL to 5V and the reference node SLR to 0V irrespective of the result of the memory discharge operation mentioned above.

Next, at timing t21, 2V is applied to the assist gate AG, 12V to the word line WL, and 5V to the source line SS, respectively. In this instance, the control signals TRL and TRR are tuned to such the voltage, for example 7V, so that the NMOS is fully turned ON, to apply the programming voltage of 5V to the bit line BLL with certainty. With this, 0V is applied to the selected bit line BLL for programming, 5V to the selected reference bit line BLR for programming, 5V to the unselected bit line BLL for programming, 0V to the unselected reference bit line BLR for programming, respectively, then the data is programmed only into the selected memory cell(s) for programming. Namely, in the selected memory cell(s) M for programming, the voltage of 0V is applied only to the bit line BLL of the memory cell M, in which the programming is insufficient at the first programming operation, so as to be performed with the programming operation again therein. Next, at timing t22, the assist gate AG, the word line WL, and the control signals TRL and TRR are turned to 0V, thereby completing the programming.

After that, verification is made on whether the programming is completed for all of the memory cells or not, and the verify operation is ended if it is decided to be completed, while the operations from the timing t7 to the timing t43 are repeated if not.

The above-mentioned is about the programming/verifying operation in the embodiment 2. According to the present embodiment, it is possible to use main portions of the circuit constructions shown in the FIG. 15A as they are.

Also, since all of the parts, but except for the sense amplifier 33, can be constructed with only the NMOS transistors, it is possible to suppress the well isolation area defined between NMOS transistor and PMOS transistor to be small, thereby obtaining small-sizing of the layout area when constructing the LSI thereof. Further, though being necessary in the embodiment 1, the operation of inverting the data on the output node SLL of the sense amplifier 33 is unnecessary, therefore it is possible to obtain a further high-speeded operation.

Also, in the same manner as in the embodiment 1, the third gate, as the assist gate of the memory cell M, can be used effectively, not only when programming the data, but also when verifying them, and in particular, the voltage being larger than that of when programming (the voltage being larger in the absolute value) is applied when verifying them, therefore, it is possible to verify the programming condition, effectively and with certainty.

<Embodiment 3>

Figure 4:
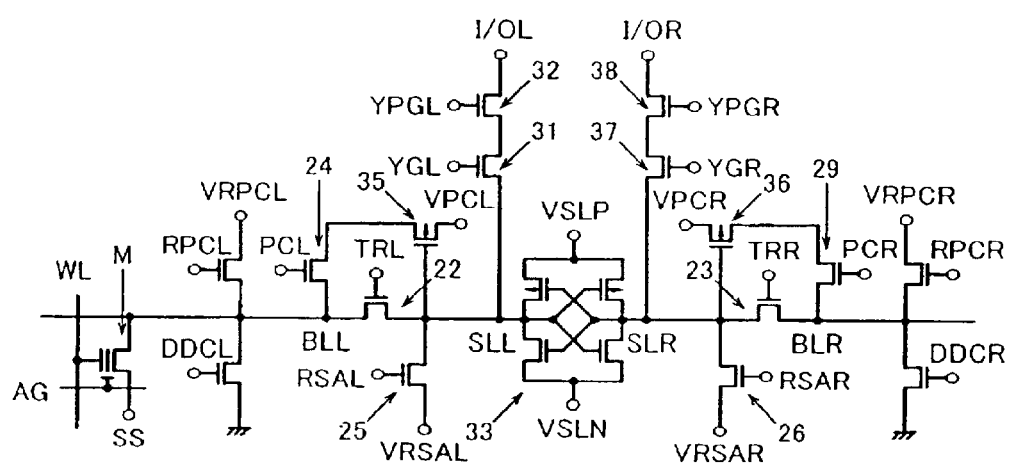
FIG. 4 is a circuit diagram for programming/verifying operation for embodiments 3 and 4, according to the present invention.
Figure 5:
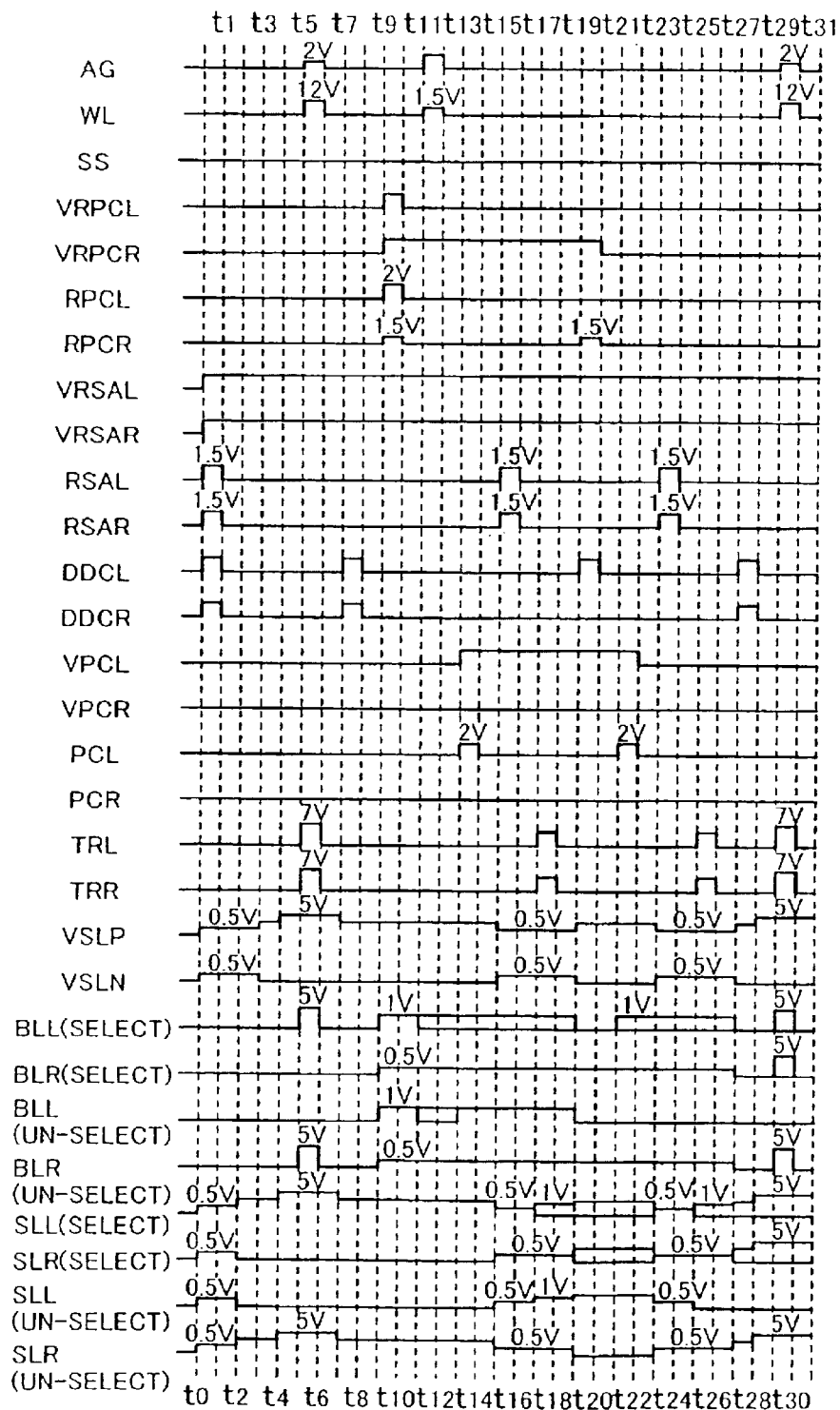
FIG. 5 is a time sequence for the verifying operation in the embodiments 3 and 5, according to the present invention.

First, explanation will be given on a third embodiment according to the present invention, by referring to FIGS. 4 and 5. The FIG. 4 shows the circuit diagram necessary for the programming/verifying operation, and the FIG. 3 a time sequence for the verifying operation thereof.

The present embodiment applies the cells of the hot-electron injection type, which was explained in the FIGS. 14A and 14B, as the memory cells, and wherein a P-type MOS transistor 35 is applied to a portion of the circuit construction shown in the FIG. 1. Although detailed operations will be omitted herein, however, after verifying that the programming is completed for all of the memory cells at first, then the programming/verifying operation will be performed as mentioned below.

First of all, at timing t0, the internal source voltages VRSAL and VRSAR are turned to 3.3V, VSLP and VSLN to 0.5V, the control signals RSAL and RSAR to 1.5V; i.e., 1V+the threshold voltage of the N-type MOS transistors, and DDCL and DDCR to 3.3V, respectively. With this, the output nodes SLL and SLR of the sense amplifier 33 are set to 0.5V, and the bit lines BLL and BLR to 0V, respectively, irrespective of the selected or the unselected condition thereof. Next, at timing t1, the control signals RSAL, RSAR, DDCL and DDCR are turned to 0V, thereby completing the setting operation for the output nodes SLL and SLR of the sense amplifier 33 and the bit lines BLL and BLR.

Next, at timing t2, in the same manner as in the embodiments mentioned above, through the Y gates (YGL and YGR) and Y pre-gates (YPGL and YPGR), 3.3V is inputted to the selected node SLL for programming, 0V to the selected reference node SLR for programming, 0V to the unselected node SLL for programming, and 3.3V to the unselected reference node SLR for programming, respectively, from the I/O line (such as, I/OL and I/OR).

Next, at timing t3, the internal supply voltages VSLP and VSLN are turned to 3.3V and 0V, respectively, thereby amplifying the data on the output nodes SLL and SLR of the sense amplifier. With this, the selected node SLL for programming comes to 3.3V, the selected reference node SLR for programming to 0V, the unselected node SLL for programming to 0V, and the unselected reference node SLR for programming to 3.3V, respectively.

Next, at timing t4, the internal supply voltages VSLP and VSLN are turned to 5V and 0V, respectively, thereby amplifying the data on the output nodes SLL and SLR of the sense amplifier 33, so as to prepare for the programming operation thereof. With this, the selected node SLL for programming comest to 5V, the selected reference node SLR for programming to 0V, the unselected node SLL for programming to 0V, and the unselected reference node SLR for programming to 5V, respectively.

Next, at timing t5, 2V is applied to the assist gate AG, i.e., the third gate 10 shown in the FIGS. 14A and 14B, while 12V to the word line WL. In this instance, the control signals TRL and TRR are turned to such the voltage, for example 7V, so that the NMOS is turned ON fully, so as to apply a programming voltage of 5V onto the bit line BLL with certainty. With this, 5V is applied to the selected bit line BLL for programming, 0V to the selected reference bit line BLR for programming, 0V to the unselected bit line BLL for programming, and 5V to the unselected reference bit line BLR for programming, respectively, therefore the data are programmed into only the selected memories for programming. Next, at timing t6, the assist gate AG, the word line WL, and the control lines TRL and TRR are tuned to 0V, thereby completing the programming.

Next, at timing t7, both the control signals DDCL and DDCR are turned to 3.3V, while the bit lines BLL and BLR are reset to 0V. Also, at the same time of this, the internal supply voltage VSLP is turned to 3.3V. With this, the selected node SLL for programming comes to 3.3V, the selected reference node SLR for programming comes to 0V, the unselected node SLL for programming comes to 0V, and the selected reference node SLR for programming comes to 3.3V, respectively. Next, at timing t8, the control signals DDCL and DDCR are turned to 0V, thereby cutting off the supply of the voltage of 0V to the bit lines BLL and BLR.

Next, at timing t9, the internal supply voltages VRPCL and VRPCR are turned to 3.3V, while the control signals RPCL and RPCR are tuned to 2V; i.e., 1V+the threshold voltage of N-type MOS transistors, and to 1.5V; i.e., 0.5V+ the threshold voltage of N-type MOS transistors, respectively. With this, all the bit lines BLL are pre-charged up to 1V, and the reference bit lines BLR up to 0.5V, irrespective of the selected or the unselected condition thereof for programming. Next, at timing t10, the internal supply voltages VRPCL and VRPCR and the control signals RPCL and RPCR are turned to 0V, thereby cutting off the supply of pre-charge voltage.

Next, at timing 11, a verify voltage; i.e., 1.5V, being smaller than the voltage 12V when programming, is applied onto the word line WL of the memory cell, while applying 3.3V, being larger than 2V when programming, onto the assist gate AG, and then the memory discharge operation is performed. In this instance, since the voltage of 1V is pre-charged onto the bit line BLL of the memory cell, no current flows in the memory cell, if the threshold voltage of the memory cell is higher than the verify voltage of 1.5 and the programming condition therein is sufficient. Due to this, the voltage on the bit line BLL is kept at 1V. On a while, if the threshold voltage of the memory cell M is lower than the verify voltage of 1.5V and the programming condition therein is insufficient, current flows in the memory cell. Due to this, the voltage on the bit line BLL is discharged down to 0V. In this instance, the reference bit line BLR is kept at 0.5 irrespective of the selected or the unselected condition thereof for programming. Next, at timing t12, the word line WL of the memory cell and the assist gate AG are turned to 0V, thereby completing the memory discharge.

Next, at timing t13, the internal supply voltage VPCL is turned to 3.3V, while the control signal PCL to 2V; i.e., 1V+the threshold voltage of the N-type MOS semiconductors. With this, only the bit line BLL when the data on the output node SLL of the sense amplifier 33 is 0V is changed from 0V to 1V. Due to this, the selected bit line BLL for programming is kept at the result of the memory discharge mentioned above as it is, while the unselected bit line BLL for programming comes to 1V irrespective of the result of the memory discharge mentioned above. In this instance, the reference bit line BLR is held at 0.5V irrespective of the selected or the unselected condition thereof for programming. Next, at timing t14, the control voltage PCL is turned to 0V, thereby cutting off the output nodes SLL of the sense amplifier 33 and the bit lines BLL.

Next, at timing t15, the internal supply voltages VSLP and VSLN are turned to 0.5V, while the control signals RSAL and RSAR to 1.5V; i.e., 0.5V+the threshold voltage of the N-type MOS transistors. With this, the output nodes SLL and SLR of the sense amplifier 33 are set to 0.5V irrespective of the selected or the unselected condition thereof for programming. Next, at timing t16, the control signals RSAL and RSAR are turned to 0V, thereby cutting off the supply of 0.5V to the output nodes SLL and SLR of the sense amplifier 33.

Next, at timing t17, the control signals TRL and TRR are turned to 3.3V, thereby transferring the data on the bit line onto the output nodes of the sense amplifier 33. With this, as the result of the memory discharge operation mentioned above, the output node SLL of the selected sense amplifier 33 for programming comes to 1V, when the bit line BLL is held at 1V, namely when the programming therein is sufficient, while it comes to 0V when the bit line BLL is discharged down to 0V, namely when the programming is insufficient therein. Also, since the unselected bit line BLL for programming is 1V irrespective of the result of the memory discharge, the output node SLL of the sense amplifier 33 comes to 1V irrespective of the result of that memory discharge. Also, the output node SLR at the reference side of the sense amplifier comes to 0.5V irrespective of the selected or the unselected condition thereof for programming. Next, at timing t18, the control signals TRL and TRR are turned to 0V. Due to this, the bit lines and the output nodes of the sense amplifier are cut off.

Next, at timing t19, the internal supply voltage VSLP and VSLN are tuned to 3.3V and 0V, respectively, thereby amplifying the data on the output nodes SLL and SLR of the sense amplifier 33. With this, the output nodes of the selected sense amplifier 33 for programming depend upon the result of the memory discharge operation; i.e., the output node SLL to 3.3V and the reference node to 0V when the programming is sufficient, while the output node SLL to 0V and the reference node to 3.3V when the programming is insufficient. Also, regardless of the result of the memory discharge mentioned above, the output nodes of the unselected sense amplifier 33 for programming come to as follows; i.e., the output node SLL to 3.3V and the reference node SLR to 0V, respectively. Further, at the same time of this, the control signals DDCL and DDCR are turned to 3.3V and to 1.5V; i.e., 0.5V+the threshold voltage of the N-type MOS transistors, respectively. With this, all the bit lines BLL are reset to 0V, while the reference bit lines BLR are pre-charged up to 0.5V, respectively, regardless of the selected or the unselected condition thereof for programming. Next, at timing t20, the control signals DDCL and RPCR are tuned to 0V, thereby cutting off the supply of 0V to the bit line BLL and 0.5V to the reference bit line BLR.

Next, due to the operations from timing t21 to timing t27, the data on the output node SLL of the sense amplifier are inverted.

First, at timing t21, the control signal PCL is turned to 2V; i.e., 1V+the threshold voltage of the N-type MOS transistors. With this, only the bit line BLL when the data on the output node SLL of the sense amplifier 33 is 0V is change from 0V to 1V. Due to this, as a result of the memory discharge operation mentioned above, the selected bit line BLL for programming comes to 0V when the programming is sufficient, while it comes to 1V when the programming is insufficient, however the unselected bit line BLL comes to 0V irrespective of the result of the memory discharge operation mentioned above. Also, the reference bit line BLR is held at 0.5V irrespective of the selected or the unselected condition thereof for programming. Next, at timing t22, the internal supply voltage VPCL and the control signal PCL are turned to 0V, thereby cutting off the output node SLL of the sense amplifier 33 and the bit line BLL.

Next, at timing t23, the internal supply voltages VSLP and VSLN are turned to 0.5V, while the control signals RSAL and RSAR to 1.5V; i.e., 0.5V+the threshold voltage of the N-type MOS transistors. With this, the output nodes SLL and SLR of the sense amplifier 33 are set to 0.5V irrespective of the selected or unselected condition thereof for programming. Next, at timing t24, the control signals RSAL and RSAR are turned to 0V, thereby cutting off the supply of 0.5V to the output nodes SLL and SLR of the sense amplifier.

Next, at timing 25, the control signals TRL and TRR are turned to 3.3V, thereby transferring the data on the bit line to the output nodes of the sense amplifier 33. With this, as the result of the memory discharge operation mentioned above, the output node SLL of the selected sense amplifier 33 for programming comes to 0V when the programming is sufficient, while it comes to 1V when it is insufficient. Also, since the unselected bit line BLL for programming comes to 0V irrespective of the result of the memory discharge, the output node SLL of the unselected sense amplifier 33 for programming comes to 0V irrespective of the result of the memory discharge. Also, the output node SLR of the sense amplifier at the reference side comes to 0.5V irrespective of the selected or the unselected condition thereof for programming. Next, at timing t26, the control signals TRL and TRR are turned to 0V. With this, the bit lines and the output nodes of the sense amplifier 33 are cut off.

Next, at timing t27, the internal supply voltages VSLP and VSLN are turned to 3.3V and 0V, respectively, thereby amplifying the data on the output nodes SLL and SLR of the sense amplifier 33. With this, the output nodes of the selected sense amplifier 33 for programming depend upon the result of the memory discharge operation mentioned above; i.e., the output node SLL comes to 0V while the reference node SLR to 3.3V when the programming is sufficient, however the output node SLL comes to 3.3V while the reference node SLR to 0V when the programming is insufficient. Also, irrespective of the memory discharge operation mentioned above, the output nodes of the unselected sense amplifier 33 for programming come to as follows; i.e., the output node SLL to 0V and the reference node SLR to 3.3V, respectively. Further, at the same time of this, the control signals DDCL and DDCR are turned to 3.3V, and the bit lines BLL and BLR are reset to 0V, respectively.

With the operations from the timing t21 to the timing t27 mentioned above, the data on the output nodes SLL and SLR of the sense amplifier 33 are inverted.

Next, at timing t28, the control signals DDCL and DDCR are turned to 0V, thereby cutting off the supply of 0V to the bit lines BLL and BLR. Also, at the same time of this, the internal supply voltages VSLP and VSLN are turned to 5V and 0V, respectively, and the data on the output nodes SLL and SLR of the sense amplifier are amplified for preparation of the programming therein. With this, the output nodes of the selected sense amplifier 33 for programming depend upon the result of the memory discharge operation mentioned above; i.e., the output node SLL comes to 0V and the reference node SLR to 5V, if the programming is sufficient, while the SLL to 5V and the reference node SLR to 0V, if the programming is insufficient. Also, the output nodes of the unselected sense amplifier 33 come to as follows; i.e., the SLL to 0V and the reference node SLR to 5V, irrespective of the result of the memory discharge operation mentioned above.

Next, at timing t29, 2V is applied to the assist gate AG while 12V to the word line WL. In this instance, the control signals TRL and TRR are tuned to such the voltage, for example 7V, so that the NMOS is fully turned ON, so as to apply the programming voltage of 5V onto the bit line BLL with certainty. With this, the selected bit lines for programming depend on the result of the memory discharge operation mentioned above; i.e., the BLL comes to 0V and the reference BLR at to 5V when the programming is sufficient, while the BLL comes to 5V and the reference BLR at to 0V when the programming is insufficient. Also, the unselected bit lines for programming come to as follows; i.e., the BLL to 0V and the reference bit line BLR to 5V, irrespective of the memory discharge operation mentioned above. Namely, in the selected memory cells for programming, the voltage of 5V is applied only to the bit line BLL of the memory cell(s), in which the programming is insufficient in the first programming operation, so as to be performed with the programming operation again. Next, at timing t30, the assist gate AG, the word line WL, and the control signals TRL and TRR are turned to 0V, thereby completing the programming.

After that, verification is made on whether the programming is completed for all of the memory cells or not, and the verify operation is ended if it is decided to be completed, while the operations from the timing t7 to the timing t31 will be repeated if not.

The above-mentioned is about the programming/verifying operation in the embodiment 3.

In the present embodiment 3, each one of the N-type MOSFETs 22 and 23 has the sense amplifier, namely, a kind of switching function for connecting the output node (corresponding to SLL or SLR) of the verify circuit 33 of the flip-flop type and the bit line (BLL or BLR), in series. Also, N-type MOSFET 24 and P-type MOSFET 35 and N-type MOSFET 29 and P-type MOSFET 36, which are connected between the source and the drain thereof, are connected between the bit line BLL and the internal supply voltage VPCL and between the BLR and the internal supply voltage VPCR, respectively, and the gates of the MOSFETs 24 and 29 are connected to the signal lines PCL and PCR, respectively, and the gates the MOSFETs 34 and 36 are connected the output nodes SLL and SLR of the sense amplifier (the flip-flop type verify circuit) 33, respectively, wherein those transistors groups perform the functions of converting the data verified by the sense amplifier 33, so as to transfer them onto the bit lines BLL and BLR, effectively.

With the present embodiment, since the inverting operation of the data on the output node of the sense amplifier is sufficient to be done by only one time, though it must be done by two (2) times in the embodiment 1, therefore it is possible to obtain the high-speed operation.

Also, in the same manner in the embodiments 1 and 2, the third gate, as the assist gate of the memory cell M, can be used effectively, not only when programming the data, but also when verifying them, and in particular, the voltage being larger than that of when programming (the voltage being larger in the absolute value) is applied when verifying them, therefore it is possible to verify the programming condition, effectively and with certainty.

<Embodiment 4>

Figure 6:
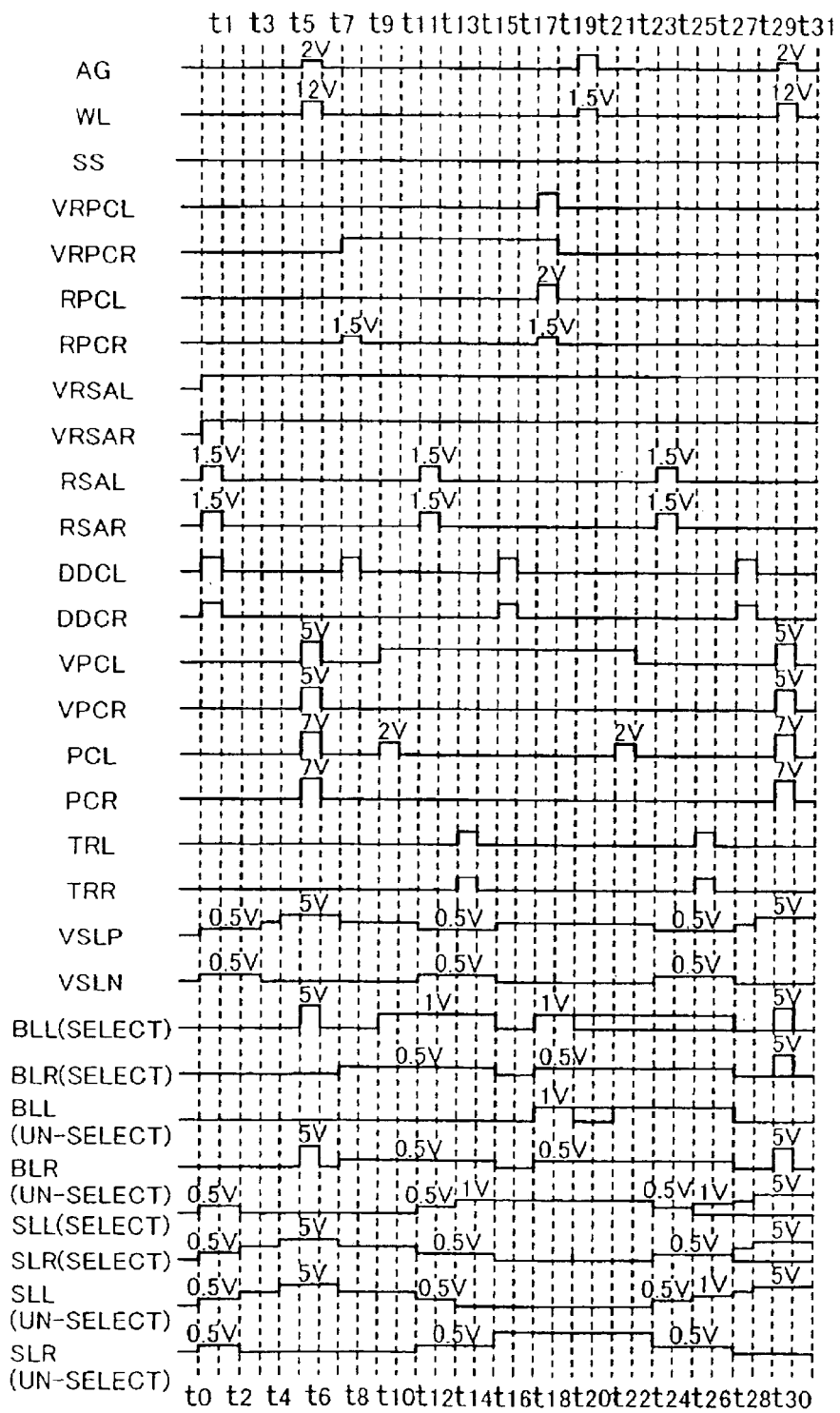
FIG. 6 is a time sequence for the verifying operation in the embodiments 4 and 6, according to the present invention.

Next, explanation will be given on a fourth embodiment according to the present invention, by referring to FIGS. 4 and 6. The FIG. 4 shows the circuit diagram necessary for the programming/verifying operation, and the FIG. 6 a time sequence for the verify operation thereof.

In the present embodiment, the circuit same to that of the embodiment 3 is used, and a method of operation will be explained, wherein the selected data for programming is assumed to 0V while the unselected data therefore to 3.3V, on the contrary to those in the embodiment 3. Though detailed operations will be omitted here, after verifying that the programming is completed for all of the memory cells at first, the programming/verifying operation will be performed as mentioned below.

First of all, at timing t0, the internal source voltages VRSAL and VRSAR are turned to 3.3V, VSLP and VSLN to 0.5V, the control signals RSAL and RSAR to 1.5V; i.e., 1V+the threshold voltage of the N-type MOS transistors, and DDCL and DDCR to 3.3V, respectively. With this, the output nodes SLL and SLR of the sense amplifier 33 are set to 0.5V, and the bit lines BLL and BLL to 0V, respectively, irrespective of the selected or the unselected condition thereof. Next, at timing t1, the control signals RSAL, RSAR, DDCL and DDCR are turned to 0V, thereby completing the setting operation for the output nodes SLL and SLR of the sense amplifier and the bit lines BLL and BLR.

Next, at timing t2, in the same manner as was mentioned in the above, through the Y gates and Y pre-gates, 0V is inputted to the selected node SLL for programming, 3.3V to the selected reference node SLR for programming, 3.3V to the unselected node SLL for programming, and 0V to the unselected reference node SLR for programming, respectively, from the I/O line (such as, I/OL and I/OR).

Next, at timing t3, the internal supply voltages VSLP and VSLN are turned to 3.3V and 0V, respectively, thereby amplifying the data on the output nodes SLL and SLR of the sense amplifier 33. With this, the selected node SLL for programming comes to 0V, the selected reference node SLR for programming to 3.3V, the unselected node SLL for programming to 3.3V, and the unselected reference node SLR for programming to 0V, respectively.

Next, at timing t4, the internal supply voltages VSLP and VSLN are turned to 5V and 0V, respectively, thereby amplifying the data on the output nodes SLL and SLR of the sense amplifier 33, so as to prepare for the programming operation thereof. With this, the selected node SLL for programming comes to 0V, the selected reference node SLR for programming to 5V, the unselected node SLL for programming to 5V, and the unselected reference node SLR for programming to 0V, respectively.

Next, at timing t5, 2V is applied to the assist gate AG, and 12V to the word line WL, respectively. In this instance, the internal supply voltages VPCL and VPCR are turned to the programming voltage of 5V, while the control signals PCL and PCR to such the voltage, for example 7V, so that the NMOS is turned ON fully, so as to apply a programming voltage of 5V onto the bit line BLL with certainty. With this, 5V is applied to the selected bit line BLL for programming, 0V to the selected reference bit line BLR for programming, 0V to the unselected bit line BLL for programming, and 5V to the unselected reference bit line BLR for programming, therefore the data are programmed only into the selected memories for programming. Next, at timing t6, the assist gate AG, the word line WL, the internal supply voltages VPCL and VPCR, and the control signals PCL and PCR are tuned to 0V, thereby completing the programming.

Next, at timing t7, the internal supply voltages VRPCR is turned to 3.3V, the control signal DDCL to 3.3V, and RPCR to 1.5V; i.e., 0.5V+the threshold value of the N-type MOS transistors, respectively. With this, irrespective of the selected and the unselected condition for programming, all the bit lines BLL are reset to 0V, while the reference bit lines BLR are pre-charged up to 0.5V. Also, at the same time of this, the internal supply voltage VSLP is turned to 3.3V. With this, the selected node SLL for programming comes to 0V, the selected reference node SLR for programming to 3.3V, the unselected node SLL for programming to 3.3V, and the selected reference node SLR for programming to 0V, respectively. Next, at timing t8, the control signals DDCL and RPCR are turned to 0V, thereby cutting off the supply of voltage of 0V to the bit lines BLL and the supply of voltage of 0.5V to the reference bit line BLR.

Next, due to the operations from the timing t9 to the timing t15, the data on the output node SLL of the sense amplifier 33 are inverted.

First, at timing t9, the internal supply voltage VPCL is turned to 3.3V, while the control signal PCL to 2V; i.e., 1V+the threshold voltage of N-type MOS transistors. With this, only the bit line BLL when the data on the output node SLL of the sense amplifier 33 is 0V is changed from 0V to 1V. Due to this, the selected bit line BLL for programming comes to 1V, while the unselected bit line BLL to 0V. Also, the reference bit line BLR is held at 0.5V irrespective of the selected or the unselected condition thereof for programming. Next, at timing t10, the control signal PCL is turned to 0V, thereby cutting off the output node SLL of the sense amplifier 33 and the bit line BLL.

Next, at timing t11, the internal supply voltages VSLP and VSLR are turned to 0.5V, and the control signals RSAL and RSAR to 1.5V; i.e., 0.5V+the threshold voltage of N-type MOS transistors, respectively. With this, the output nodes SLL and SLR of the sense amplifier 33 are set to 0.5V irrespective of the selected or the unselected condition thereof for programming. Next, at timing t12, the control signals RSAL and RSAR are turned to 0V, thereby cutting off the supply of 0.5V to the output nodes SLL and SLR of the sense amplifier.

Next, at timing t13, the control signals TRL and TRR are turned to 3.3V, thereby transferring the data on the bit lines to the output nodes of the sense amplifier 33. With this, the output node SLL of the selected sense amplifier 33 for programming comes to 1V, the selected reference node SLR for programming to 0.5V, the unselected output node SLL for programming to 0V, and the unselected reference node SLR for programming to 0.5V, respectively. Next, at timing t14, the control signals TRL and TRR are tuned to 0V, thereby cutting off the bit line and the output node of the sense amplifier.

Next, at timing t15, with turning the internal supply voltages VSLP and VSLN to 3.3V and 0V, respectively, the data on the output nodes SLL SLR of the sense amplifier 33 are amplified. With this, the selected node SLL for programming comes to 3.3V, the selected reference node SLR for programming to 0V, the unselected node SLL for programming to 0V, and the unselected reference node SLR for programming to 3.3V, respectively. Also, at the same time of this, the control signals DDCL and DDCR are tuned to 3.3V, while the bit lines BLL and BLR are reset to 0V.

Due to the above-mentioned operations from the timing t9 to the timing t15, the data on the output nodes SLL and SLR are inverted. Next, at timing t16, the control signals DDCL and DDCR are tuned to 0V, thereby cutting off the supply of 0V to the bit lines BLL and BLR.

Next, at timing t17, the internal supply voltages VRPCL is turned to 3.3V, while the control signals RPCL and RPCR to 2.V; i.e., 1V+the threshold voltage of the N-type MOS transistors, and to 1.5V; i.e., 0.5V+the threshold voltage of the N-type MOS transistors, respectively. With this, all the output nodes SLL are pre-charged up to 1V, and the reference bit lines BLR up to 0.5V, irrespective of the selected or the unselected condition thereof for programming. Next, at timing t18, the internal supply voltages VRPCL and VRPCR, the control signals RPCL and RPCR are turned to 0V, thereby cutting off the supply of the pre-charge voltage.

Next, at timing t9, a verify voltage; i.e., 1.5V, being smaller than the voltage 12V when programming, is applied onto the word line WL of the memory cell, while applying 3.3V, being larger than 2V when programming, onto the assist gate AG, and then the memory discharge operation is performed. In this instance, since the voltage of 1V is pre-charged onto the bit line BLL of the memory cell, no current flows in the memory cell, if the threshold voltage of the memory cell is higher than the verify voltage of 1.5V and if the programming condition therein is sufficient. Due to this, the voltage on the bit line BLL is kept at 1V. On a while, if the threshold voltage of the memory cell is lower than the verify voltage of 1.5V and if the programming condition therein is insufficient, current flows in the memory cell. Due to this, the voltage on the bit line BLL is discharged down to 0V. In this instance, the reference bit line BLR is kept at 0.5 irrespective of the selected or the unselected condition thereof for programming. Next, at timing t20, the word line WL of the memory cell and the assist gate AG are turned to 0V, thereby completing the memory discharge.

Next, at timing t21, the control signal PCL is turned to 2V; i.e., 1V+the threshold voltage of the N-type MOS semiconductors. With this, only the bit line BLL when the data on the output node SLL is 3.3V is changed from 0V to 1V. Due to this, as the result of the memory discharge mentioned above, the selected bit line BLL for programming comes to 1V when the programming is sufficient, while it comes to 0V when the programming is insufficient, however the unselected bit line BLL for programming comes to 1V irrespective of the memory discharge mentioned above. Also, the reference bit line BLR is held at 0.5V irrespective of the selected or the unselected condition thereof for programming. Next, at timing t22, the internal supply voltage VPCL and the control voltage PCL are turned to 0V, thereby cutting off the output node SLL of the sense amplifier 33 and the bit line BLL.

Next, at timing t23, the internal supply voltages VSLP and VSLN are turned to 0.5V, while the control signals RSAL and RSAR to 1.5V; i.e., 0.5V+the threshold voltage of the N-type MOS transistors. With this, the output nodes SLL and SLR of the sense amplifier 33 are set to 0.5V irrespective of the selected or the unselected condition thereof for programming. Next, at timing t24, the control signals RSAL and RSAR are turned to 0V, thereby cutting off the supply of 0.5V to the output nodes SLL and SLR of the sense amplifier.

Next, at timing t25, the control signals TRL and TRR are turned to 3.3V, thereby transferring the data on the bit line to the output node of the sense amplifier 33. With this, as the result of the memory discharge operation mentioned above, the output node SLL of the selected sense amplifier 33 for programming comes to 1V when the programming therein is sufficient, while it comes to 0V when the programming is insufficient. Also, since the unselected bit line BLL for programming is 1V irrespective of the result of the memory discharge, the output node SLL of the sense amplifier 33 comes to 1V irrespective of the result of that memory discharge. Also, the reference output node SLR of the sense amplifier 33 comes to 0.5V irrespective of the selected or the unselected condition thereof for programming. Next, at timing t26, the control signals TRL and TRR are turned to 0V. With this, the bit line and the output node of the sense amplifier are cut off.

Next, at timing t27, the internal supply voltage VSLP and VSLN are tuned to 3.3V and 0V, respectively, thereby amplifying the data on the output nodes SLL and SLR of the sense amplifier 33. With this, the output nodes of the selected sense amplifier 33 for programming depend upon the result of the memory discharge operation; i.e., the output node SLL to 3.3V and the reference node to 0V when the programming is sufficient, while the output node SLL to 0V and the reference node to 3.3V when the programming is insufficient. Also, regardless of the result of the memory discharge mentioned above, the output nodes of the unselected sense amplifier 33 for programming come to as follows; i.e., the output node SLL to 3.3V and the reference node SLR to 0V, respectively. Further, at the same time of this, the control signals DDCL and DDCR are tuned to 3.3V, and the bit lines BLL and BLR are reset to 0V. Next, at timing t28, the control signals DDCL and DDCR are turned to 0V, thereby cutting of the supply of 0V to the bit lines BLL and BLR.

Also, at the same of this, the internal source voltages VSLP and VSLN are turned to 5V and 0V, respectively, thereby amplifying the data on the output nodes SLL and SLR of the sense amplifier for preparation of programming thereof. With this, as a result of the memory discharge operation mentioned above, the output nodes of the selected sense amplifier 33 for programming come to as follows; i.e., the SLL to 5V and the reference node SLR to 0V when the programming is sufficient, while the SLL to 0V and the reference node to 5V when the programming is insufficient. Also, irrespective of the memory discharge mentioned above, the output nodes of the unselected sense amplifier 33 come to as follows; i.e., the SLL to 5V and the reference node SLR to 0V, respectively.

Next, at timing t29, 2V is applied to the assist gate AG while 12V to the word line WL. In this instance, the internal supply voltages are turned to 5V of the programming voltage, while the control signals PCL and PCR are tuned to such the voltage, for example 7V, so that the NMOS is fully turned ON, so as to apply the programming voltage of 5V to the bit line BLL with certainty. With this, the selected bit lines for programming depend upon the result of the memory discharge operation mentioned above; i.e., the BLL comes to 0V and the reference BLR to 5V when the programming is sufficient, while the BLL comes to 5V and the reference BLR to 0V when the programming is insufficient. Also, the unselected bit lines for programming come to as follows; i.e., the BLL to 0V and the reference bit line BLR to 5V, irrespective of the memory discharge operation mentioned above. Namely, in the selected memory cells for programming, the voltage of 5V is applied only to the bit line BLL of the memory cell(s), in which the programming is insufficient at the first programming operation, so as to be performed with the programming operation again. Next, at timing t30, the assist gate AG, the word line WL, the internal supply voltages VPCL and VPCR, and the control signals TRL and TRR are turned to 0V, thereby completing the programming.

After that, verification is made on whether the programming is completed for all of the memory cells or not, and the verifying operation is ended if it is decided to be completed, while the operations from the timing t7 to the timing t31 will be repeated if not.

The above-mentioned is about the programming/verifying operation in the embodiment 4. With the present embodiment, since the inverting operation of the data on the output node of the sense amplifier is sufficient to be done by only one time though it must be done by two (2) times in the embodiment 1, therefore it is possible to obtain the high-speed operation.

Also, in the same manner in the each embodiment mentioned above, the third gate, as the assist gate of the memory cell M, can be used effectively, not only when programming the data, but also when verifying them, and in particular, the voltage being larger than that of when programming (the voltage being larger in the absolute value) is applied when verifying them, therefore it is possible to verify the programming condition, effectively and with certainty.

<Embodiment 5>

Figure 7:
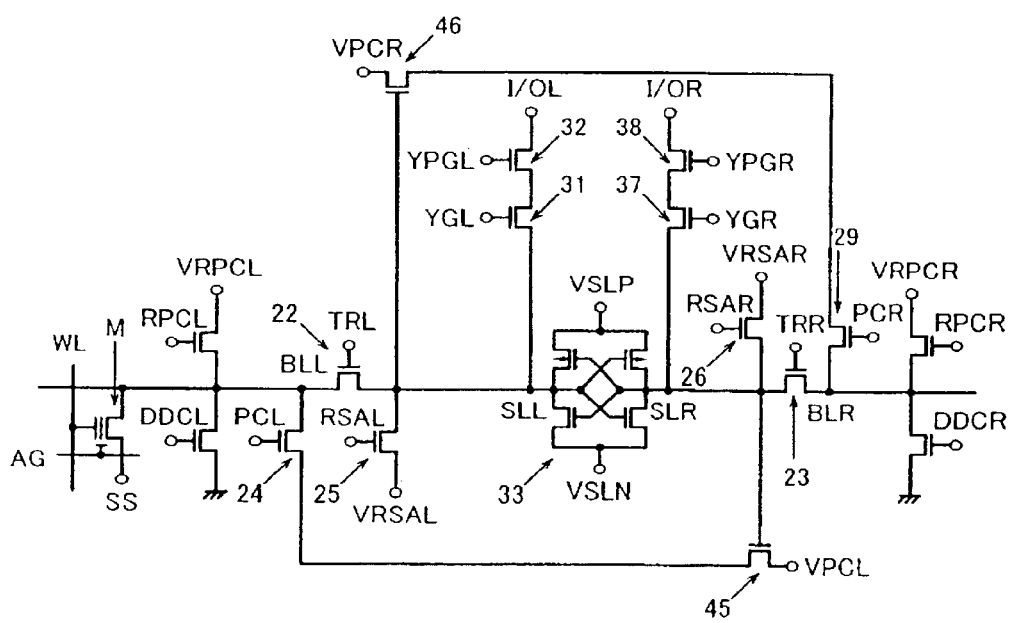
FIG. 7 is a circuit diagram for programming/verifying operation in the embodiments 5 and 6, according to the present invention.

FIG. 7 is a circuit diagram of the circuit necessary for the programming/verifying operation in a fifth embodiment.

With this circuit, the P-type MOS transistor 35, which is connected to the internal supply voltage VPCL within the circuit shown in the FIG. 4 as the embodiment 3, is changed to a N-type MOS transistor 45, and the gate of the above-mentioned N-type MOS transistor 45 connected to the output node SLL of the sense amplifier 33 is connected to the reference node SLR. Also, in the same manner, the P-type MOS transistor 36 connected to the internal supply voltage VPCR is changed to a N-type MOS transistor 46, and the gate of the above-mentioned N-type MOS transistor 46, which is connected to the output node SLR of the sense amplifier 33, is connected to the node SLL. With this, the programming/verifying operation can be obtained, in the completely same manner as in the embodiment 3 shown in the FIG. 5. Accordingly, the detailed explanation on the programming/verifying operation will be omitted herein.

The present embodiment 5, as was mentioned previously, is same to the FIG. 1, in the aspects that the N-type MOSFETs 24 and 45 and the N-type MOSFETs 29 and 46, which are connected in series between the source and the drain thereof, are connected between the bit line BLL and the internal supply voltage VPCL and between the BLR and the internal supply voltage VPCR, respectively, and that the gates of the MOSFETs 24 and 29 are connected to the signal lines PCL and PCR, respectively, but it is different from that in the aspect that the gates of the MOSFETs 45 and 46 are connected to the output nodes SLL and SLR of the sense amplifier (the flip-flop type verify circuit) 33, respectively; however wherein, in the same manner in the FIG. 1, those transistors groups perform the functions of converting the data verified by the sense amplifier 33, so as to transfer them onto the bit lines BLL and BLR, effectively.

Also, according to the present embodiment, since all of the parts, but except for the sense amplifier 33, can be constructed with the NMOS transistors, it is possible to suppress the well isolation areas defined between NMOS transistor and PMOS transistor to be small, thereby obtaining small-sizing of the layout area thereof.

With the present embodiment, since the inverting operation of the data on the output node of the sense amplifier is sufficient to be done by only one time, though it must be done by two (2) times in the embodiment 1, therefore it is possible to obtain the high-speed operation.

<Embodiment 6>

An embodiment 6, which applies the circuit same to that of the embodiment 5, performs an operating method, in which the program selecting data is set to 0V while the program unselecting data to 3.3V, on the contrary to those in the embodiment 5. In the operation, it is possible to obtain the programming/verifying operation totally same to that of the embodiment 4 shown in the FIG. 6. Accordingly, the detailed explanation of the programming/verifying operation will be omitted, herein.

According to the present embodiment, since all of the parts, but except for the sense amplifier 33, can be constructed with the NMOS transistors, it is possible to suppress the well isolation areas defined between NMOS transistor and PMOS transistor to be small, thereby obtaining small-sizing of the layout area thereof. Also, since the inverting operation of the data on the output node of the sense amplifier is sufficient to be done by only one time, though it must be done by two (2) times in the embodiment 1, therefore it is possible to obtain the high-speed operation.

<Embodiment 7>

Figure 8:
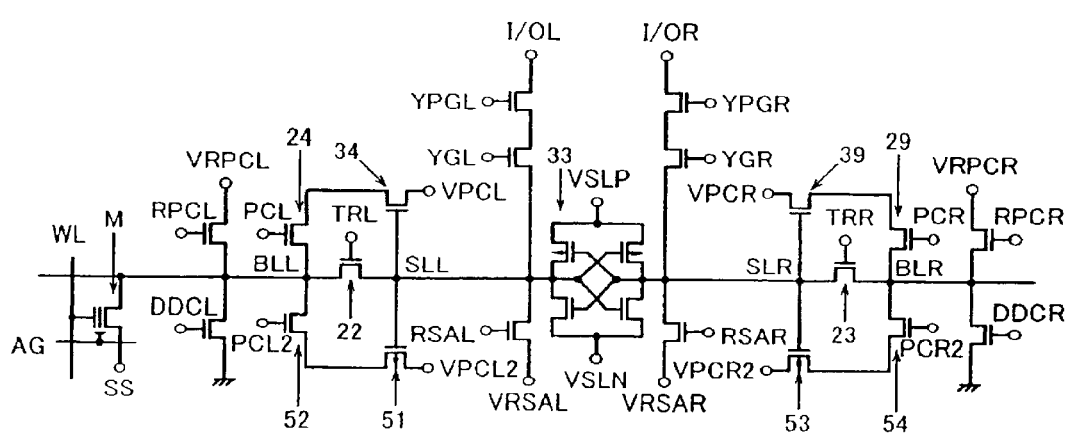
FIG. 8 is a circuit diagram for programming/verifying operation in an embodiment 7, according to the present invention.
Figure 9:
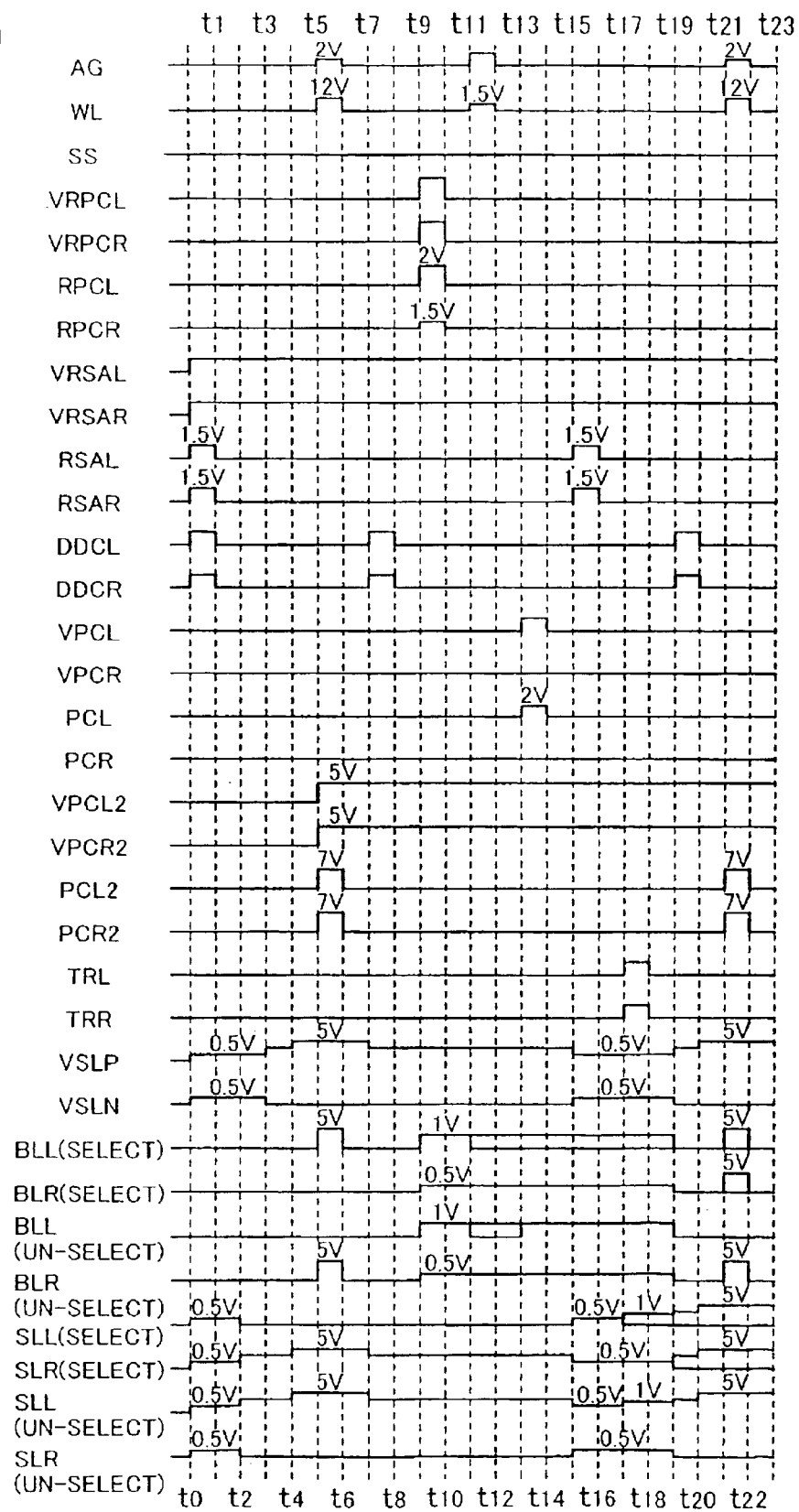
FIG. 9 is a time sequence for the verifying operation in the embodiment 7, according to the present invention.

Next, explanation will be given on a fourth embodiment according to the present invention, by referring to FIGS. 8 and 9. The FIG. 8 shows the circuit diagram necessary for the programming/verifying operation, and the FIG. 9 a time sequence for the verify operation thereof.

In the present embodiment, further the P-type MOS transistors 51 and 53 and N-type MOS transistors 52 and 54 are provided in the circuit, which was shown in the FIG. 1. Though detailed operations will be omitted here, after verifying that the programming is completed for all of the memory cells at first, the programming/verifying operation will be performed as mentioned below.

First of all, at timing t0, the internal source voltages VRSAL and VRSAR are turned to 3.3V, VSLP and VSLN to 0.5V, the control signals RSAL and RSAR to 1.5V; i.e., 1V+the threshold voltage of the N-type MOS transistors, and DDCL and DDCR to 3.3V, respectively. With this, the output nodes SLL and SLR of the sense amplifier 33 are set to 0.5V, irrespective of the selected or the unselected condition thereof for programming, and the bit lines BLL and BLR to 0V, respectively. Next, at timing t1, the control signals RSAL, RSAR, DDCL and DDCR are turned to 0V, thereby completing the setting operations for the output nodes SLL and SLR of the sense amplifier 33 and the bit lines BLL and BLR.

Next, at timing t2, through the Y gates (YGL, YGR) and Y pre-gates (YPGL, YPGR), 0V is inputted to the selected node SLL for programming, 3.3V to the selected reference node SLR for programming, 3.3V to the unselected node SLL for programming, and 0V to the unselected reference node SLR for programming, respectively, from the I/O line (such as, I/OL and I/OR), in the same manner as was in the embodiments mentioned above.

Next, at timing t3, the internal supply voltages VSLP and VSLN are turned to 3.3V and 0V, respectively, thereby amplifying the data on the output nodes SLL and SLR of the sense amplifier 33. With this, the selected node SLL for programming comes to 0V, the selected reference node SLR for programming to 3.3V, the unselected node SLL for programming to 3.3V, and the unselected reference node SLR for programming to 0V, respectively.

Next, at timing t4, the internal supply voltages VSLP and VSLN are turned to 5V and 0V, respectively, thereby amplifying the data on the output nodes SLL and SLR of the sense amplifier 33, so as to prepare for the programming operation of data. With this, the selected node SLL for programming comes to 0V, the selected reference node SLR for programming to 5V, the unselected node SLL for programming to 5V, and the unselected reference node SLR for programming to 0V, respectively.

Next, at timing t5, 2V is applied to the assist gate AG, and 12V to the word line WL, respectively. In this instance, the internal supply voltages VPCL2 and VPCR2 are turned to the programming voltage of 5V, and the control signals PCL2 and PCR2 to such the voltage, for example 7V, so that the NMOS is turned ON fully, so as to apply a programming voltage of 5V onto the bit line BLL with certainty. With this, 5V is applied to the selected bit line BLL for programming, 0V to the selected reference bit line BLR for programming, 0V to the unselected bit line BLL for programming, and 5V to the unselected reference bit line BLR for programming, therefore the data are programmed into only the selected memories for programming. Next, at timing t6, the assist gate AG, the word line WL, the control signals PCL2 and PCR2 are tuned to 0V, thereby completing the programming.

Next, at timing t7, both the control signals DDCL and DDCR are turned to 3.3V, while the bit lines BLL and BLR are reset to 0V. Also, at the same time, the internal supply voltage VSLP is turned to 3.3V. With this, the selected node SLL for programming comes to 0V, the selected reference node SLR for programming to 3.3V, the unselected node SLL for programming to 3.3V, and the selected reference node SLR for programming to 0V, respectively. Next, at timing t8, the control signals DDCL and DDCR are turned to 0V, thereby cutting off the supply of the voltage of 0V to the bit lines BLL and BLR.

Next, at timing t9, the internal supply voltages VRPCL and VRPCR are turned to 3.3V, while the control signals RPCL and RPCR are tuned to 2V; i.e., 1V+the threshold voltage of N-type MOS transistors, and to 1.5V; i.e., 0.5V+ the threshold voltage of N-type MOS transistors, respectively. With this, irrespective of the selected and the unselected condition for programming, all the bit lines BLL are pre-charged up to 1V, while the reference bit lines BLR up to 0.5V. Next, at timing t10, the internal supply voltages VRPCL and VRPCR and the control signals RPCL and RPCR are turned to 0V, thereby cutting off the supply of pre-charge voltage.

Next, at timing 11, a verify voltage; i.e., 1.5V, being smaller than the voltage 12V when programming, is applied onto the word line WL of the memory cell M, while applying 3.3V; being larger than the voltage when programming, onto the assist gate AG, and then the memory discharge operation is performed. In this instance, since the voltage of 1V is pre-charged onto the bit line BLL of the memory cell M, no current flows in the memory cell, if the threshold voltage of the memory cell is higher than the verify voltage of 1.5 and the programming is in sufficient condition therein. Due to this, the voltage on the bit line BLL is kept at 1V. On a while, if the threshold voltage of the memory cell M is lower than the verify voltage of 1.5V and the programming condition therein is insufficient, current flows in the memory cell. Due to this, the voltage on the bit line BLL is discharged down to 0V. In this instance, the reference bit line BLR is kept at 0.5 irrespective of the selected or the unselected condition thereof for programming. Next, at timing t12, the word line WL of the memory cell M and the assist gate AG are turned to 0V, thereby completing the memory discharge.

Next, at timing t13, the internal supply voltage VPCL is turned to 3.3V, while the control signal PCL to 2V; i.e., 1V+the threshold voltage of the N-type MOS semiconductors. With this, only the bit line BLL when the data on the output node SLL of the sense amplifier 33 is 3.3V is changed from 0V to 1V. Due to this, the selected bit line BLL for programming is kept at the result of the memory discharge mentioned above as it is, and the unselected bit line BLL for programming comes to 1V irrespective of the result of the memory discharge mentioned above. In this instance, the reference bit line BLR is held at 0.5V irrespective of the selected or the unselected condition thereof for programming. Next, at timing t14, the internal supply voltage VPCL and the control voltage PCL are turned to 0V, thereby cutting off the output node SLL of the sense amplifier 33 and the bit line BLL.

Next, at timing t15, the internal supply voltages VSLP and VSLN are turned to 0.5V, while the control signals RSAL and RSAR to 1.5V; i.e., 0.5V+the threshold voltage of the N-type MOS transistors. With this, the output nodes SLL and SLR of the sense amplifier 33 are set to 0.5V irrespective of the selected or the unselected condition thereof for programming. Next, at timing t16, the control signals RSAL and RSAR are turned to 0V, thereby cutting off the supply of 0.5V to the output nodes SLL and SLR of the sense amplifier 33.

Next, at timing t17, the control signals TRL and TRR are turned to 3.3V, thereby transferring the data on the bit line to the output node of the sense amplifier 33. With this, as the result of the memory discharge operation mentioned above, the output node SLL of the selected sense amplifier 33 for programming comes to 1V, when the programming therein is sufficient, while to 0V when the programming is insufficient. Also, since the unselected bit line BLL for programming is 1V irrespective of the result of the memory discharge, the output node SLL of the sense amplifier 33 comes to 1V irrespective of the result of that memory discharge. Also, the output node SLR at the reference side of the sense amplifier comes to 0.5V irrespective of the selected or the unselected condition thereof for programming. Next, at timing t18, the control signals TRL and TRR are turned to 0V. Due to this, the bit lines and the output nodes of the sense amplifier are cut off.

Next, at timing t19, the internal supply voltage VSLP and VSLN are tuned to 3.3V and 0V, respectively, thereby amplifying the data on the output nodes SLL and SLR of the sense amplifier 33. With this, the output nodes of the selected sense amplifier 33 for programming depend upon the result of the memory discharge operation; i.e., the output node SLL to 3.3V and the reference node to 0V when the programming is sufficient, while the output node SLL to 0V and the reference node to 3.3V when the programming is insufficient. Also, regardless of the result of the memory discharge mentioned above, the output nodes of the unselected sense amplifier 33 for programming come to as follows; i.e., the output node SLL to 3.3V and the reference node SLR to 0V, respectively. Further, at the same time of this, the control signals DDCL and DDCR are tuned to 3.3V, and the bit lines BLL and BLR are reset to 0V. Next, at timing t20, the control signals DDCL and DDCR are turned to 0V, thereby cutting of the supply of 0V to the bit lines BLL and BLR.

Also, at the same time, the internal supply voltages VSLP and VSLN are turned to 5V and 0V, respectively, thereby amplifying the data on the output nodes SLL and SLR of the sense amplifier 33 for preparation of the programming therein. With this, the output nodes of the selected sense amplifier 33 for programming depend upon the result of the memory discharge operation mentioned above; i.e., the output node SLL comes to 5V and the reference node SLR to 0V, when the programming is sufficient, while the SLL to 0V and the reference node SLR to 5V, when the programming is insufficient. Also, irrespective of the result of the memory discharge operation mentioned above, the output nodes of the unselected sense amplifier 33 come to as follows; i.e., the SLL to 5V and the reference node SLR to 0V.

Next, at timing t21, 2V is applied to the assist gate AG and 12V to the word line WL, respectively. In this instance, the control signals PCL2 and PCR2 are tuned to such the voltage, for example 7V, so that the NMOS is fully turned ON, so as to apply the programming voltage of 5V to the bit line BLL with certainty. With this, as a result of the memory discharge operation mentioned above, the selected bit lines for programming come as follows; i.e., the bit line BLL comes to 0V and the reference bit line BLR to 5V, when the programming is sufficient, while the bit line BLL to 5V and the bit line BLR to 0V, when the programming is insufficient, respectively. Also, with the unselected bit lines for programming, irrespective of the result of the memory discharge mentioned above, the BLL comes to 0V and the reference bit line BLR to 5V, respectively. Namely, in the selected memory cells M for programming, the voltage of 5V is applied only to the bit line BLL of the memory cell(s), in which the programming is insufficient at the first programming operation, so as to be performed with the programming operation again. Next, at timing t22, the assist gate AG, the word line WL, and the control signals PCL2 and PCR2 are turned to 0V, thereby completing the programming.

After that, verification is made on whether the programming is completed for all of the memory cells or not, and the verify operation is ended if it is decided to be completed, while the operations from the timing t7 to the timing t23 will be repeated if not.

The above-mentioned is about the programming/verifying operation in the embodiment 7.

In the present embodiment 7, in addition to the FIG. 1, the N-type MOSFET 52 and the P-type MOSFET 51 and the N-type MOSFET 54 and P-type MOSFET 53, which are connected in series between the source and the drain thereof, are connected between the bit line BLL and the internal supply voltage VPCL2 and between the BLR and the internal supply voltage VPCR2, respectively; the gates of the MOSFETs 52 and 54 are connected to the signal lines PCL2 and PCR2, respectively; and the gates the MOSFETs 51 and 53 are connected to the output nodes SLL and SLR of the sense amplifier (the verify circuit of the flip-flop type). 33, respectively, wherein those transistors groups perform the functions of converting the data verified by the sense amplifier 33, so as to transfer them onto the bit lines BLL and BLR, effectively.

Namely, in the present embodiment, though being necessary in the embodiment 1, the operation of inverting the data on the output node SLL of the sense amplifier 33 is unnecessary, therefore it is possible to obtain the operation high-speeded further more.

<Embodiment 8>

Figure 10:
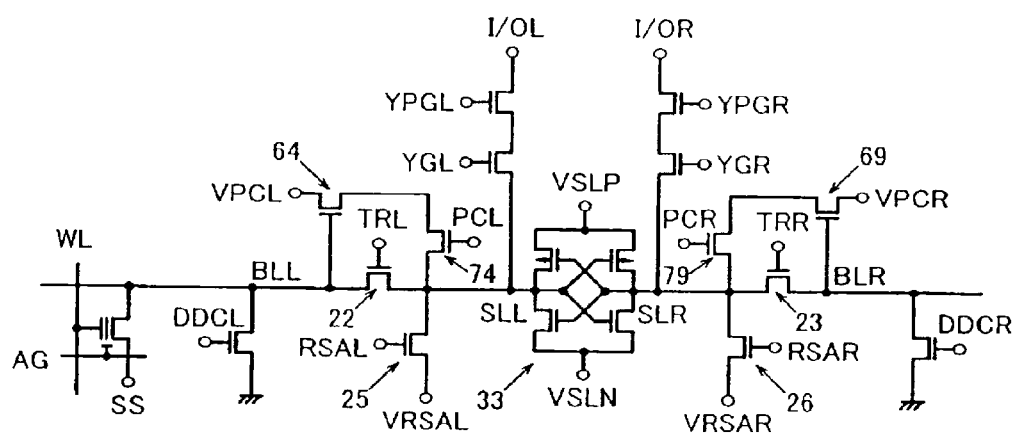
FIG. 10 is a circuit diagram for programming/verifying operation for an embodiment 8, according to the present invention.
Figure 11:
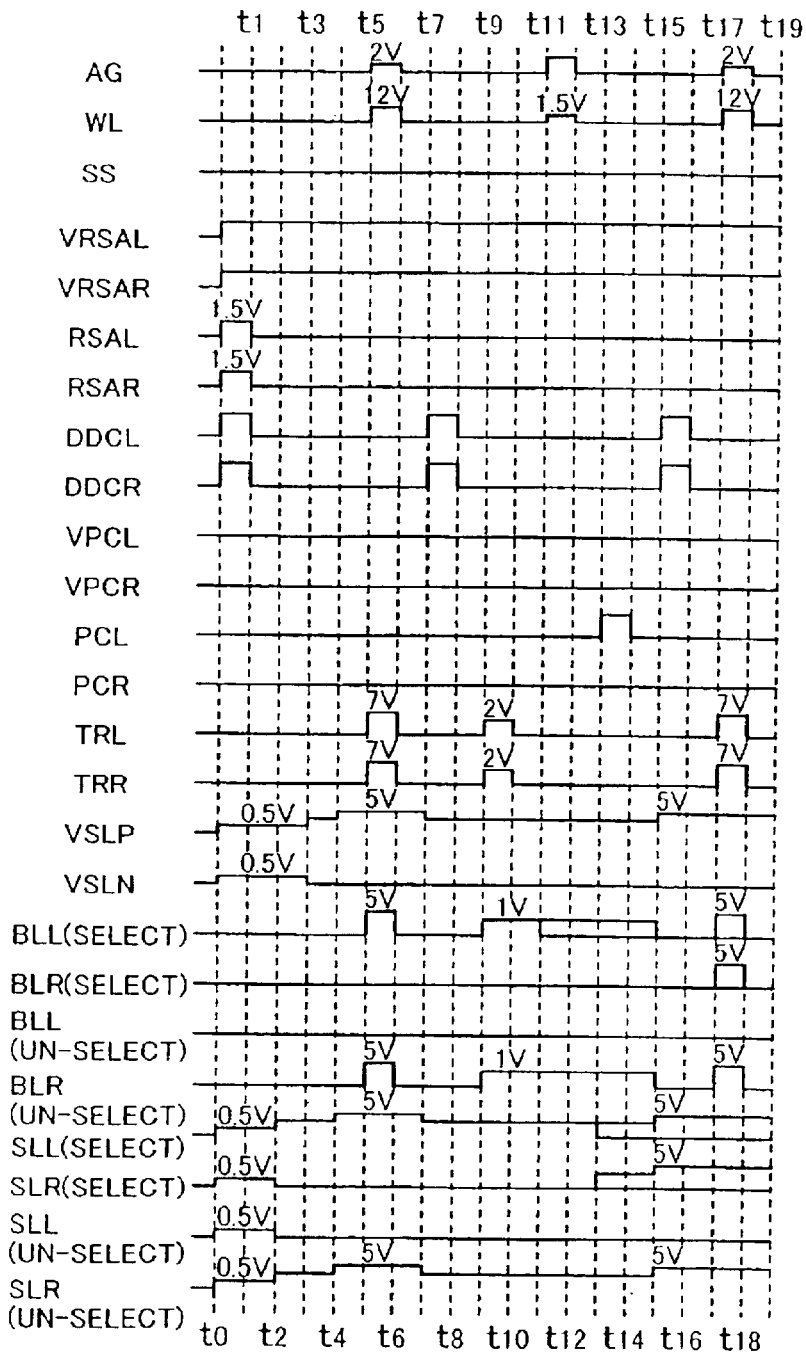
FIG. 11 is a time sequence for the verifying operation in the embodiment 8, according to the present invention.
Figure 12A:
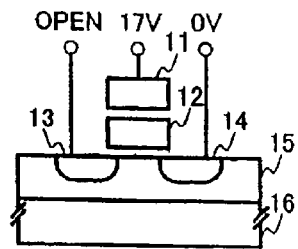
FIGS. 12A and 12B are the cross-section views of an essential portion of memory cell, for explanation of the programming operation through FN type-tunneling phenomenon.
Figure 12B:
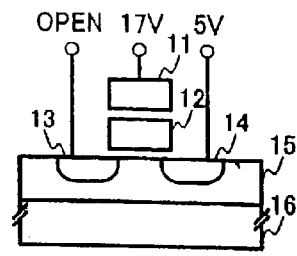
Figure 13A:
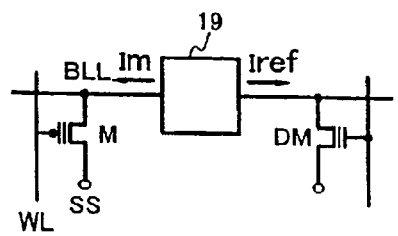
FIGS. 13A and 13B are outline circuit diagrams for explanation of methods for verifying the programmed data.
Figure 13B:
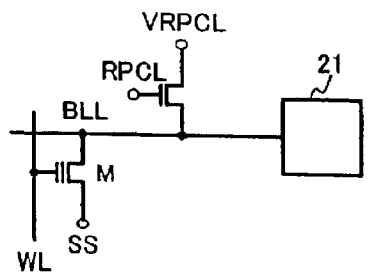

Next, explanation will be given on an eighth embodiment according to the present invention, by referring to FIGS. 10 and 11. The FIG. 10 shows the circuit diagram necessary for the programing/verifying operation, and the FIG. 11 a time sequence for the verify operation thereof.

According to the present embodiment, the gates of the NMOS transistors 64 and 69 corresponding to the NMOS transistors 34 and 39, the sources of which are connected to the internal supply voltages VPCL and VPCR in the circuit construction shown in the FIG. 1, are connected, not to the output nodes SLL and SLR of the sense amplifier 33, but to the bit lines BLL and BLR, and further the sources of the NMOS transistors 74 and 79, which are connected with the above-mentioned NMOS transistors in series, are connected, not to the bit lines BLL and BLR, but to the output nodes SLL and SLR of the sense amplifier 33, in the circuit construction shown in the FIG. 1.

Although detailed operations will be omitted herein, after verifying that the programming is completed for all of the memory cells at first, the programming/verifying operation will be performed as mentioned below.

First of all, at timing t0, the internal source voltages VRSAL and VRSAR are turned to 3.3V, VSLP and VSLN to 0.5V, the control signals RSAL and RSAR to 1.5V; i.e., 1V+the threshold voltage of the N-type MOS transistors, and DDCL and DDCR to 3.3V, respectively. With this, irrespective of the selected or the unselected condition for programming, the output nodes SLL and SLR of the sense amplifier are set to 0.5V, while the bit lines BLL and BLR to 0V. Next, at timing t1, the control signals RSAL, RSAR, DDCL and DDCR are turned to 0V, thereby completing the setting operation for the output nodes SLL and SLR of the sense amplifier and the bit lines BLL and BLR.

Next, at timing t2, in the same manner as was mentioned in the above, through the Y gates and Y pre-gates, 3.3V is inputted to the selected node SLL for programming, 0V to the selected reference node SLR for programming, 0V to the unselected node SLL for programming, and 3.3V to the unselected reference node SLR for programming, respectively, from the I/O line (such as, I/OL and I/OR).

Next, at timing t3, the internal supply voltages VSLP and VSLN are turned to 3.3V and 0V, respectively, thereby amplifying the data on the output nodes SLL and SLR of the sense amplifier 33. With this, the selected node SLL for programming comes to 3.3V, the selected reference node SLR for programming to 0V, the unselected node SLL for programming to 0V, and the unselected reference node SLR for programming to 3.3V, respectively.

Next, at timing t4, the internal supply voltages VSLP and VSLN are turned to 5V and 0V, respectively, thereby amplifying the data on the output nodes SLL and SLR of the sense amplifier 33, so as to prepare for the programming operation thereof. With this, the selected node SLL for programming comes to 5V, the selected reference node SLR for programming to 0V, the unselected node SLL for programming to 0V, and the unselected reference node SLR for programming to 5V, respectively.

Next, at timing t5, 2V is applied to the assist gate AG, and 12V to the word line WL, respectively. In this instance, the control signals PCL and PCR are turned to such the voltage, for example 7V, so that the NMOS is turned ON fully, so as to apply a programming voltage of 5V onto the bit line BLL with certainty. With this, 5V is applied to the selected bit line BLL for programming, 0V to the selected reference bit line BLR for programming, 0V to the unselected bit line BLL for programming, and 5V to the unselected reference bit line BLR for programming, therefore the data are programmed only into the selected memories for programming. Next, at timing t6, the assist gate AG, the word line WL, and the control signals PCL and PCR are tuned to 0V, thereby completing the programming.

Next, at timing t7, both the control signals DDCL and DDCR are turned to 3.3V, thereby resetting the bit lines BLL and BLR to 0V. Also, at the same time of this, the internal supply voltage VSLP is turned to 3.3V. With this, the selected node SLL for programming comes to 3.3V, the selected reference node SLR for programming comes to 0V, the unselected node SLL for programming comes to 0V, and the selected reference node SLR for programming comes to 3.3V, respectively. Next, at timing t8, the control signals DDCL and DDCR are turned to 0V, thereby cutting off the supply of the voltage of 0V to the bit lines BLL and BLR.

Next, at timing t9, the control signals TRL and TRR are tuned to 2V; i.e., 1V+the threshold voltage of N-type MOS transistors. With this, all the bit lines BLL are pre-charged up to 1V, while the reference bit lines BLR up to 0.5V. Next, at timing t10, the control signals TRL and TRR are turned to 0V, thereby cutting off the supply of pre-charge voltage.

Next, at timing 11, a verify voltage, i.e., 1.5V, being smaller than the voltage 12V when programming, is applied onto the word line WL of the memory cell M, while applying 3.3V, being higher than the voltage being applied when programming, onto the assist gate AG, and then the memory discharge operation is performed. In this instance, since the voltage of 1V is pre-charged onto the bit line BLL of the memory cell, no current flows in the memory cell, if the threshold voltage of the memory cell M is higher than the verify voltage of 1.5V and if the programming condition is sufficient therein. Due to this, the voltage on the bit line BLL is kept at 1V. On a while, if the threshold voltage of the memory cell M is lower than the verify voltage of 1.5V and if the programming condition therein is insufficient, current flows in the memory cell. Due to this, the voltage on the bit line BLL is discharged down to 0V. In this instance, since the unselected bit line BLL for programming is 0V, no memory discharge operation occurs, and it is held at 0V. Also, the reference bit line BLR is kept at 0V when it is selected for programming, while at 1V when it is unselected for programming. Next, at timing t12, the word line WL of the memory cell and the assist gate AG are turned to 0V, thereby completing the memory discharge.

Next, at timing t13, the control signal PCL is turned to 3.3V. In this instance, the internal supply voltage VPCL is 0V. With this, only the output node SLL of the sense amplifier when the bit line BLL is 1V is changed from 3.3V to 0V. With this, as the result of the memory discharge operation mentioned above, the output nodes of the selected sense amplifier 33 for programming comes to as follows; i.e., the output node SLL to 0V and the reference node SLR to 3.3V, when the programming therein is sufficient, while the output node SLL to 3.3V and the reference node SLR to 0V, when the programming is insufficient therein. Also, the output node SLL of the unselected sense amplifier 33 for programming comes to 0V and the reference node SLR thereof to 3.3V, irrespective of the result of the memory discharge operation mentioned above. Next, at timing t14, the control voltage PCL is turned to 0V, thereby cutting off the node SLL of the sense amplifier 33 and the bit line BLL.

Next, at timing t15, the control signals DDCL and DDCR are turned to 3.3V, thereby resetting the bit lines BLL and BLR. Also, at the same time of this, the internal supply voltages VSLP and VSLN are turned to 5V and 0V, respectively, thereby amplifying the data on the output nodes SLL and SLR of the sense amplifier 33 for preparation of the programming operation thereof. Due to this, as the result of the memory discharge operation mentioned above, the node SLL of the selected sense amplifier for programming comes to 0V and the reference node SLR thereof to 5V, when the programming is sufficient, while the output node SLL comes to 5V and the reference node SLR to 0V when the programming is insufficient. Also, irrespective of the result of the memory discharge operation mentioned above, the output nodes of the unselected sense amplifier 33 for programming come to as follows; the node SLL to 0V while the reference node SLR to 5V. Next, at timing 16, the control signals DDCL and DDCR are turned to 0V, thereby cutting off the supply of 0V to the bit lines BLL and BLR.

Next, at timing t17, 2V is applied to the assist gate AG, and 12V to the word line WL, respectively. In this instance, the control signals PRL and TRR are tuned to such the voltage, for example 7V, so that the NMOS is fully turned ON, so as to apply the programming voltage of 5V to the bit line BLL with certainty. With this, as a result of the memory discharge operation mentioned above, the selected bit lines for programming come as follows; i.e., the bit line BLL to 0V and the reference bit line BLR to 5V, when the programming is sufficient, while the bit line BLL to 5V and the bit line BLR to 0V, when the programming is insufficient. Also, with the unselected bit lines for programming, the BLL comes to 0V and the reference bit line BLR to 5V, respectively, irrespective of the result of the memory discharge mentioned above. Namely, in the selected memory cells M for programming, the voltage of 5V is applied only to the bit line BLL of the memory cell(s), in which the programming is insufficient in the first programming operation, so as to be performed with the programming operation again. Next, at timing t18, the assist gate AG, the word line WL, and the control signals PCL2 and PCR2 are turned to 0V, thereby completing the programming.

After that, verification is made on whether the programming is completed for all of the memory cells or not, and the verify operation is ended if it is decided to be completed, while the operations from the timing t7 to the timing t19 will be repeated if not.

The above-mentioned is about the programming/verifying operation in the embodiment 8.

In the present embodiment 8, each one of N-type MOSFETs 22 and 23 has the sense amplifier, namely a kind of switching function for connecting the output node (corresponding to the SLL or SLR) of the verify circuit 33 of the flip-flop type and the bit line (BLL or BLR), in series. Also, N-type MOSFETs 74 and 64 and N-type MOSFETs 79 and 69, which are connected in series between the source and the drain thereof, are connected between the output node SLL of the sense amplifier 33 and the internal supply voltage VPCL and between the SLR and the internal supply voltage VPCR, respectively; the gates of the MOSFETs 64 and 79 are connected to the signal lines PCL and PCR, respectively; and the gates the MOSFETs 64 and 69 are connected to the bit lines BLL and BLR, respectively, wherein those transistors groups, as was mentioned in the above, perform the functions of converting the data verified by the sense amplifier 33, thereby to transfer them onto the bit lines BLL and BLR, effectively.

According to the present embodiment, since all of the parts, but except for the sense amplifier, can be constructed with the NMOS transistors, it is possible to suppress the well isolation area defined between NMOS transistor and PMOS transistor to be small, thereby obtaining small-sizing of the layout area thereof. Also, though being necessary in the embodiment 1, the operation of inverting the data on the output node SLL of the sense amplifier is unnecessary, therefore it is also possible to obtain the operation high-speeded further more.

In the above, the explanation was given on the present invention, in particular, in details on the basis of the embodiments mentioned above, however, the present invention can be applied, not only to such the two-level storage, but also to a four-level storage and a multi-level storage, too.

Figure 17A:
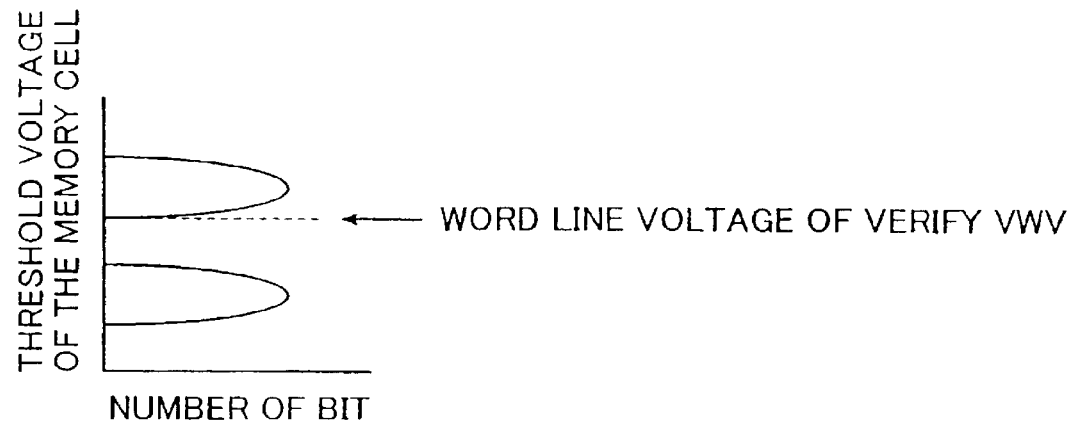
FIGS. 17A and 17B are views of showing out line characteristics, for explanation of multi-level storage.

In FIG. 17A is shown distribution of the threshold voltage in the case of the two-level storage. In the two-level storages, as is shown in this FIG. 17A, they can be divided into two conditions, i.e., the one is that the threshold voltage of the memory cell is higher than a certain value, and the other that it is lower than that, in other words, they have t2-level data. Accordingly, when being verified, the voltage of 1V, for example, is applied to the bit line while the verify voltage VWV to the word line, and then the condition of the programming data is detected. Namely, if the threshold voltage of the memory cell is higher than the verify voltage VWV and no current flows therein, the programming is completed without change in the 1V applied onto the bit line, however, if the threshold voltage of the memory cell is lower than the verify voltage VWV, so that current flows therein, the 1V falls down to 0V, and then it is decided or determined that the programming is not completed yet.

Figure 17B:
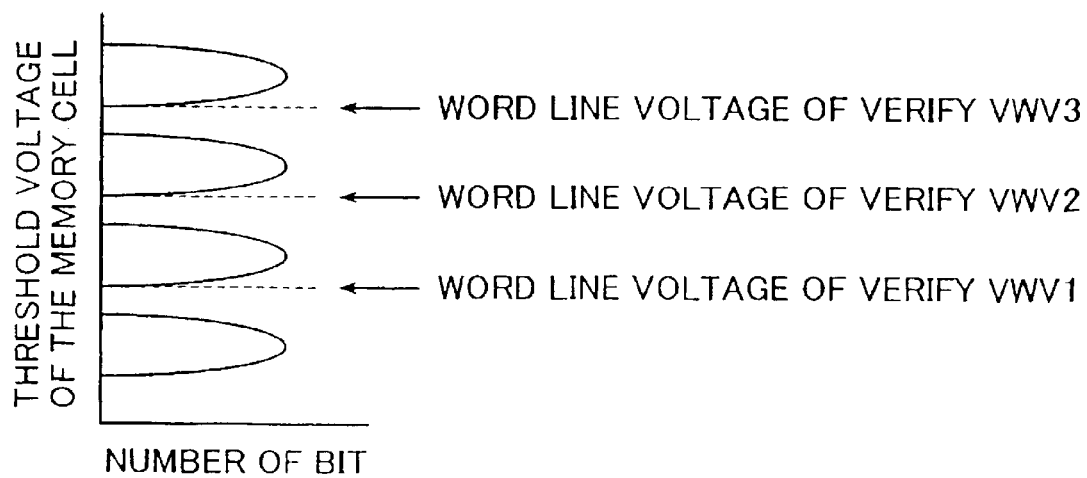

On the contrary to this, in the four-level storage, the threshold voltage of the each memory cell can be divided into four conditions, as is shown in FIG. 17B, i.e., it has 4-level data. In the verification of such the multi-level storage, the condition of the programming data is detected, while changing the verify voltage variably. The operations other than that are same to those in the two-level storage, basically. Namely, it can done, at first, by detecting the condition of the programming data with the verify voltage VWV, for example, and thereafter, by detecting the condition of the programming data with the verify voltage VWV2, and further at the end, by detecting the condition of the programming data with the verify voltage VWV3. With such the method as was mentioned above, the present invention can be applied not only to the two-level storage, but also to such the multi-level storage.

Next, explanation will be given on a semiconductor memory having the third gate (i.e., the assist gate), which was applied into the various embodiment of the present invention.

Figure 18:
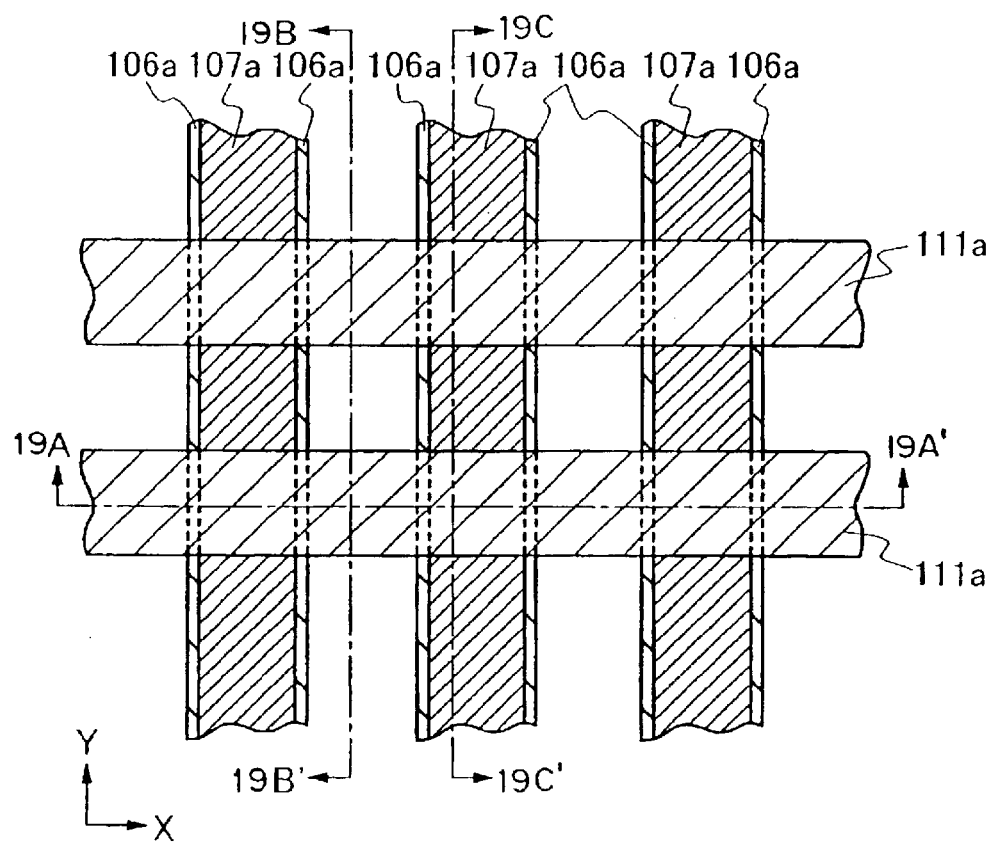
FIG. 18 is a plan view of an essential portion of the memory cell matrix.
Figure 19A:
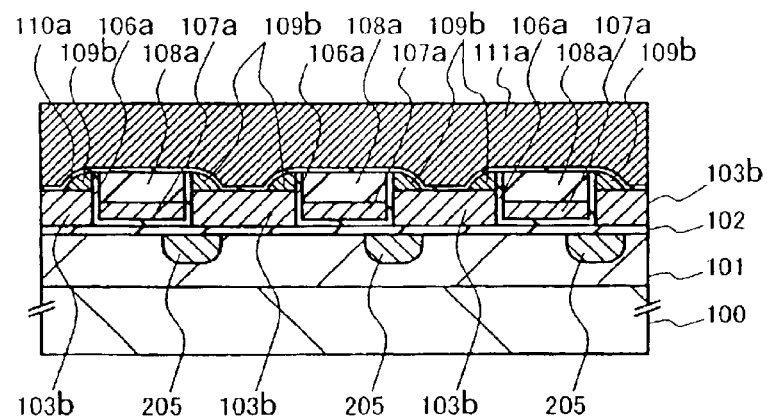
FIGS. 19A, 19B and 19C are cross-section views of the essential portions of the memory cell matrixes.
Figure 19B:
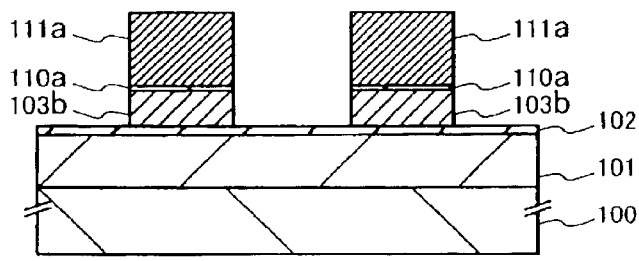
Figure 19C:
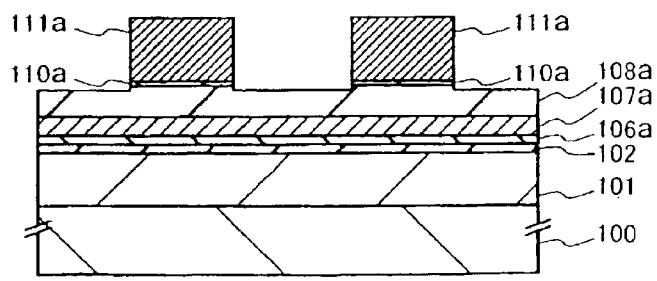

FIG. 18 shows a partial plane diagram of showing a memory cell matrix, with which a plural number of the memory cells are disposed in the vertical and horizontal directions on a surface of one (1) piece of the semiconductor substrate, and FIGS. 19A, 19B and 19C show cross section diagrams along with lines A—A, B—B and C—C in the FIG. 18, respectively.

Upon the main surface of a N-type Si semiconductor substrate 100 is formed a P-type well 101, on the surface of which well are formed a plural number of N-type semiconductor layers 105 (forming the source and drain regions, so as to construct a portion of a bit line) along with one of the directions thereof. On this main surface are formed floating gates 103b and third gates (i.e., the assist gate) 107a via a first insulation layer 102 of $SiO_2$, etc. On the floating gates 103b are formed control gates 111a through a second insulation layer 110a. The plural third gates 107a are formed extending along with the above-mentioned one direction on the N-type semiconductor layer 105, while the plural control gates 111 extending along with the direction being orthogonal thereto, thereby constructing the word lines. Further, reference numerals 106a and 108a indicate insulator films, and they insulate and separate the third gates from the floating gates 103b and the control gates 111a. A reference numeral 109b indicates a layer of polysilicon, and this increases the surface area of the floating gates 103b, thereby increasing up a coupling ratio of the memory cells. Also, for the purpose of letting the third gates 107a to function effectively, N-type semiconductor layers 205 are disposed under the floating gates 103b and the third gates 107a, so that the N-type semiconductor layers 205 are riding over them.

Figure 20:
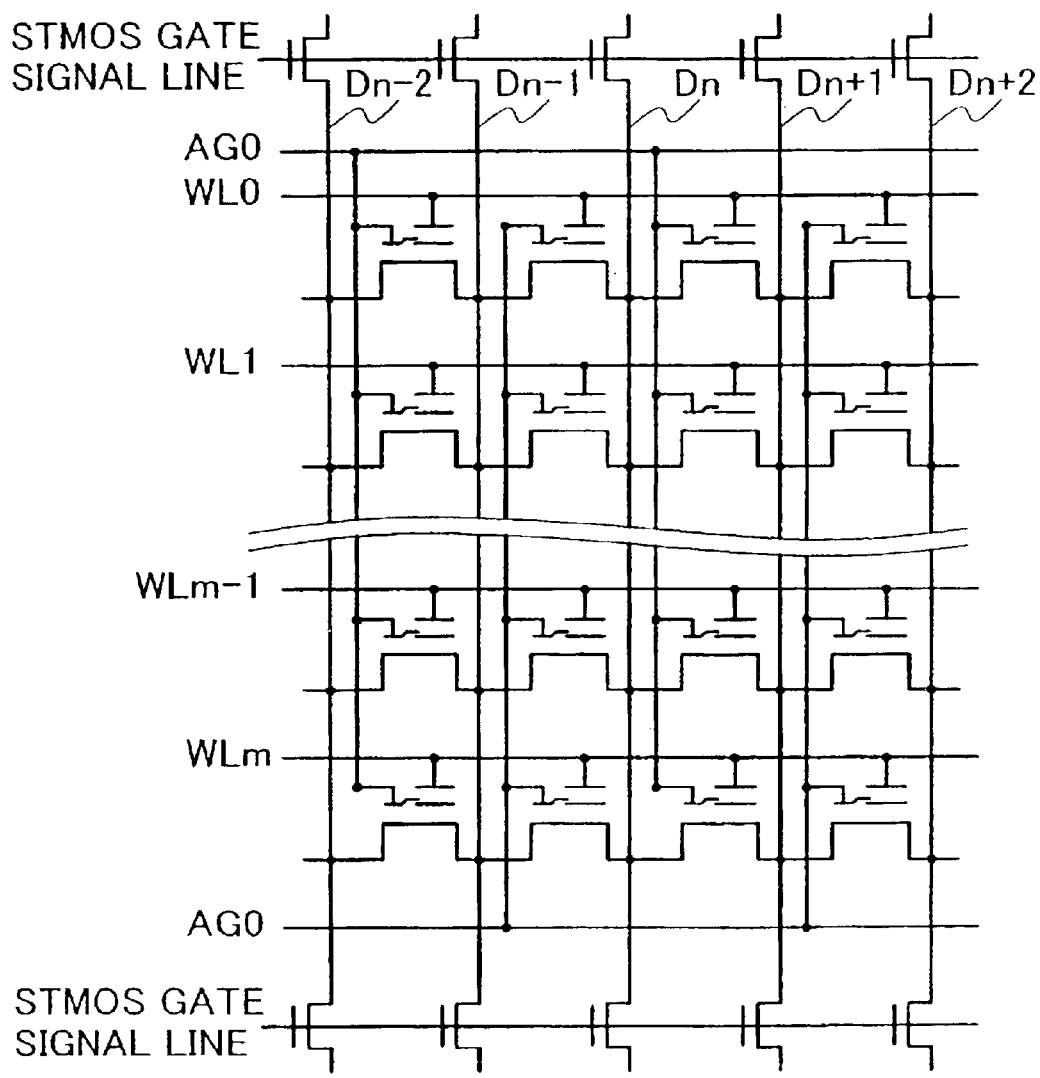
FIG. 20 is a circuit diagram of the essential portion of the memory cell matrix.

FIG. 20 is a circuit diagram of an essential portion of a memory cell matrix array that is formed thereby, for showing the structure thereof. Dn−2 to Dn+2 in the figure indicate the N-type semiconductor layers, which form the source and the drain, and they form a part of the bit lines. WL0 to WLm indicate the word lines connected to the control gates, and they are constructed with select MOSFETs (STMOSs) for selecting source lines or data lines. However, the explanation on the operations of writing and/or deleting data will be omitted herein, for the purpose of simplification thereof.

Figure 21:
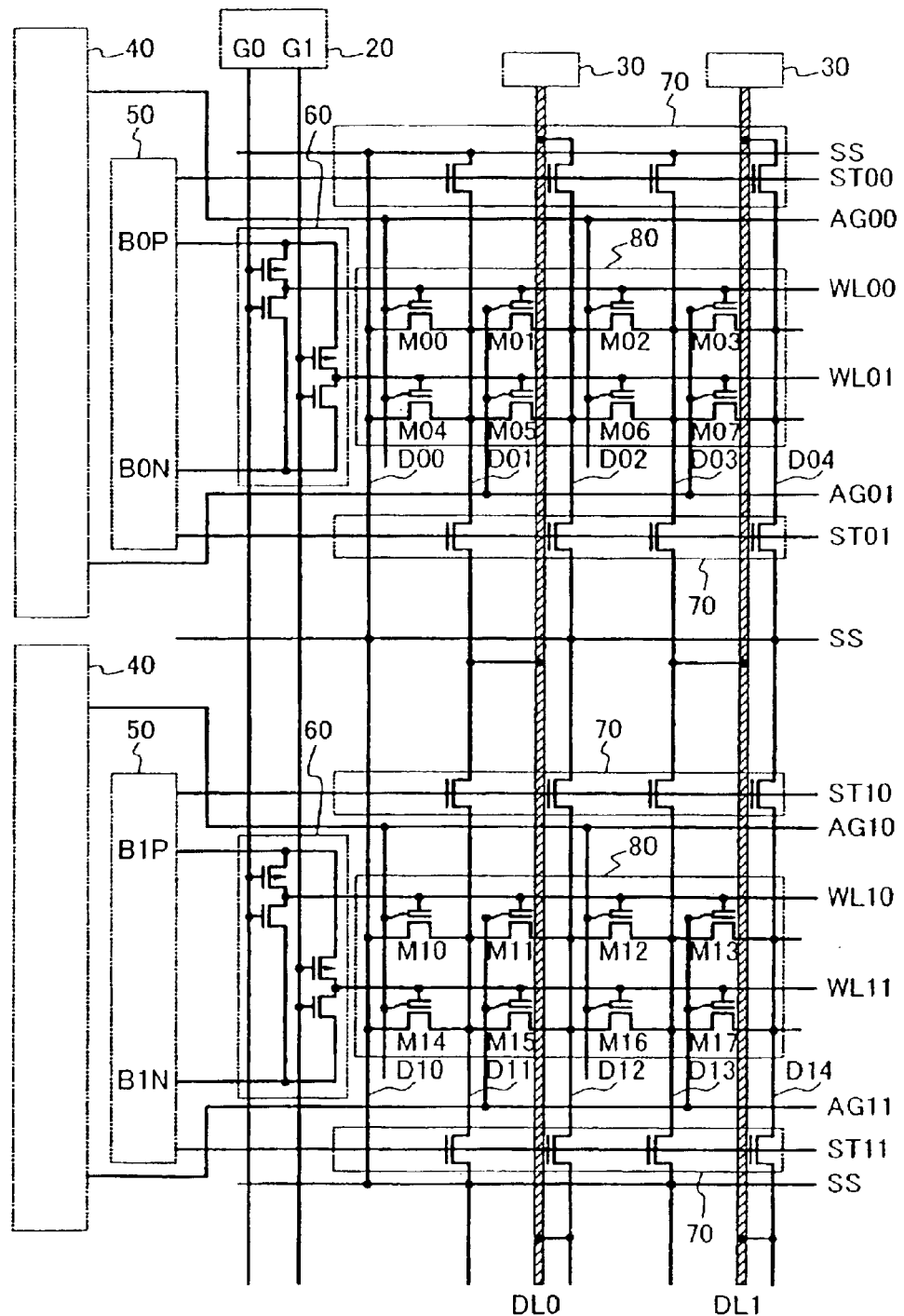
FIG. 21 is also a circuit diagram of the essential portion of the memory cell matrix.

FIG. 21 is a circuit diagram of an essential portion of a nonvolatile semiconductor memory device, in which the integrated circuits are formed with such the memory arrays. This device comprises memory cell arrays 80, assist gate decoders 40, block decoders 50, sub-decoders 60, gate decoders 20, select transistor circuits 70 and sense amplifiers 30. A word decoder has a hierarchical structure, such as, a block decoder 50, a sub-decoder 60 and a gate decoder 20, for obtaining a high speed operation thereby. Detailed explanation of this device will be omitted herein.

Figure 22:
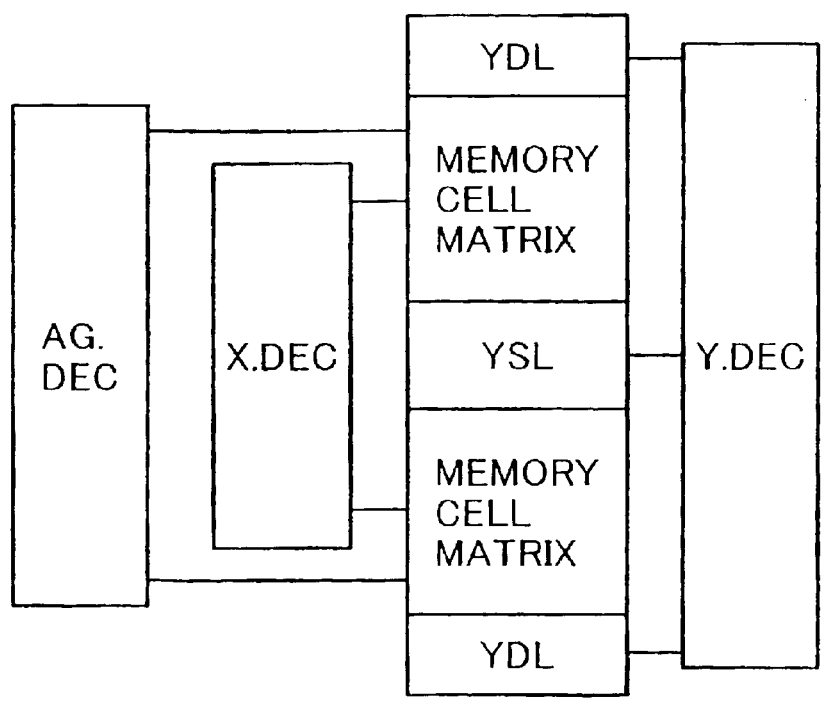
FIG. 22 is a block view of the essential portion of the nonvolatile semiconductor memory device.

FIG. 22 is a rough block diagram of such the nonvolatile semiconductor memory device, and brief explanation will be given on the function of each element block, by referring to the FIGS. 21 and 22 together.

AG.DEC indicates the third gate, i.e., the decoder circuit of the assist gate (AG), and this corresponds to the circuit 40 shown in the FIG. 21. And, X.DEC indicates a X decoder and corresponds to the circuit 20, 50 or 60 in the FIG. 21.

The memory cell matrix is divided into a plural number of blocks, wherein one block is selected among the plural blocks by means of the block decoder circuit 50, while one (1) word line is selected within the one (1) block by means of the gate decoder circuit 20. This is for relief or mitigation of disturbance, being caused by a fact that voltage is applied to the drain of the unselected memory cell. In the unselected cell, the selected transistor is turned to OFF, therefore no voltage is applied onto the drain thereof.

The sub-decoder 60 is provided for the purpose of rising up such a drivability of the word line. When the memory cell matrix comes to be large, the word line comes to be long, therefore the drivability of the word line is reduced down. Then, it is preferable to increase the drivability of the word line, by dividing the word line, so that sub-decoders (i.e., the drivers) being small in the circuit-scale thereof are provided for each of the word lines.

YSL indicates a circuit, into which a circuit is added to a portion of the circuit that was explained in the various embodiments of the present invention, for determining whether all the memory cells are programmed or not (i.e., ALL discrimination circuit), but except for the memory cell M in the circuit diagram thereof.

YDL indicates a circuit for holding the data programmed therein, and the circuit construction is almost same to that of the YSL. In particular, in a case of the multi-level storage, this must be provided in plural number thereof, for example, two (2) YDLs are necessary for each of the bit lines in the case of the four-level storage.

Y.DEC indicates a Y decoder, and signals from which are connected to Y gate and Y pre-gate within the YSL and YLD (for example, YGL and YPGL in the FIG. 1), respectively.

As can be understood from the above, according to the present invention, it is possible to realize a nonvolatile semiconductor memory device and an electronic circuit system including thereof, being operable at high speed but with a low electric power, and/or being high in an accuracy of verification thereof. For example, the present invention may be applied to a one-chip microcomputer (semiconductor system), equipped with a memory cell array portion having the nonvolatile semiconductor memory cells therein.

However, the present invention should not be restricted only to the embodiments mentioned above, and it is of course susceptible to change or modify the present invention within an ambit thereof, without departing from the gist or spirit thereof.

Additional notes: Though derailed explanation was given on the present invention heretofore, however also the followings fall within the scope of the present invention.

(1) A nonvolatile semiconductor memory device, comprising:

a memory cell, having a well of first conductive type formed on a main surface of a semiconductor substrate, a second semiconductor source/drain diffusion layer region, formed along with a fist direction within said well, a first gate formed on said semiconductor substrate through a first insulator film, and a second gate formed on said first gate through a second insulator film;

a word line control circuit for driving a word line connected to said second gate;

a program data holding circuit, being able to hold a program data of N bits;

a programming voltage generator circuit for applying programming voltage onto a bit line, which is connected to a drain of said second semiconductor source/drain diffusion layer region; and a discrimination circuit for verifying said program data, wherein programming of data to said memory cell is conducted by applying positive independent voltages to said second gate and the drain of said second semiconductor layer, respectively, while injecting hot electron generating in a channel portion in vicinity of the drain when 0V is applied to said well of the first conductive type and the source of said second semiconductor layer, thereby to increase a threshold voltage of said memory cell, and the verification of said programmed data is conducted by applying a verify voltage to said second gate, while applying a positive voltage to the drain of said second semiconductor layer and 0V to said well of the first conductive type and the source of said second conductor layer, thereby verifying whether the positive voltage applied to the drain of said second semiconductor layer is maintained as it is or comes down to 0V, depending upon a height of the threshold voltage of said memory cell, by means of said discrimination circuit.

(2) The nonvolatile semiconductor memory device, as described in the above (1), wherein said discrimination circuit is constructed with a verify circuit of flip-flop type, a first MOS transistor for connecting said verify circuit and said bit line in series, and a plural number of MOS transistor groups for converting the data which are verified by said verify circuit, so as to transfer them to said bit line, wherein the verified data are inverted at least one (1) time in a series of operations of said programming and verification.

(3) The nonvolatile semiconductor memory device, as described in the above (2), wherein said first MOS transistor is constructed with a N-type MOS transistor, said MOS transistor group 1 is constructed with a second N-type MOS transistor and a third N-type MOS transistor which are connected in series, wherein a gate of said first MOS transistor is connected a first signal line, a source of said second N-type MOS transistor to said bit line, a source of said third N-type MOS transistor to an internal supply voltage, a gate of said second N-type MOS transistor to a second signal line, and a gate of said third N-type MOS transistor to a first or second output node of said verify circuit of flip-flop type, respectively.

(4) The nonvolatile semiconductor memory device, as described in the above (2), wherein said first MOS transistor is constructed with a N-type MOS transistor, said MOS transistor group 1 is constructed with a second N-type MOS transistor and a P-type MOS transistor which are connected in series, wherein a gate of said first MOS transistor is connected a first signal line, a source of said second N-type MOS transistor to said bit line, a source of said P-type MOS transistor to an internal supply voltage, a gate of said second N-type MOS transistor to a second signal line, and a gate of said P-type MOS transistor to a first or second output node o said verify circuit of flip-flop type, respectively.

(5) The nonvolatile semiconductor memory device, as described in the above (1), wherein said discrimination circuit is constructed by a verify circuit of flip-flop type, a first MOS transistor for connecting said verify circuit and said bit line in series, and a plural number of MOS transistor groups for converting the data which are verified by said verify circuit, so as to transfer them to said bit line, wherein said first MOS transistor is constructed with a N-type MOS transistor, said MOS transistor group 1 is constructed with a MOS transistor group 2 comprising a second N-type MOS transistor and a third N-type MOS transistor which are connected in series, and a MOS transistor group 3 comprising a fourth N-type MOS transistor and a P-type MOS transistor which are connected in series, and wherein, a gate of said first MOS transistor is connected to a first signal line, sources of said second N-type MOS transistor and said fourth N-type MOS transistor to said bit line, a source of said third N-type. MOS transistor to an internal supply voltage, a source of said P-type MOS transistor to a second internal supply voltage, a gate of said second N-type MOS transistor to a second signal line, a gate of said fourth N-type MOS transistor to a third signal line, and gates of said third N-type MOS transistor and said P-type MOS transistor to an output node of said verify circuit of flip-flop type, respectively.

(6) The nonvolatile semiconductor memory device, as described in the above (1), wherein said discrimination circuit is constructed with a verify circuit of flip-flop type, a first MOS transistor for connecting said verify circuit and said bit line in series, and a plural number of MOS transistor groups for converting the data on the bit line, so as to transfer them to said verify circuit of flip-flop type, wherein said first MOS transistor is constructed with a N-type MOS transistor, said MOS transistor group 1 is constructed with a second N-type MOS transistor and a third N-type MOS transistor which are connected in series, and wherein a gate of said first MOS transistor is connected to a first signal line, a source of said second N-type MOS transistor to an output node of said verify circuit of flip-flop type, a source of said third N-type MOS transistor to an internal supply voltage, and a gate of said second N-type MOS transistor to said bit line, respectively.

(7) A nonvolatile semiconductor memory device, comprising:

a memory cell, having a well of first conductive type formed on a main surface of a semiconductor substrate, a second semiconductor source/drain diffusion layer region, formed along with a fist direction within said well, a first gate formed on said semiconductor substrate through a first insulator film, and a second gate formed on said first gate through a second insulator film;

a word line control circuit for driving a word line connected to said second gate;

a program data holding circuit, being able to hold a program data of N bits;

a programming obstruction voltage generator circuit for applying programming obstruction voltage onto a bit line, which is connected to a drain of said second semiconductor source/drain diffusion layer region; and a discrimination circuit for verifying said programmed data, wherein programming of data to said memory cell is conducted by applying positive independent voltages to said second gate and the drain of said second semiconductor layer, respectively, while injecting hot electron generating in a channel portion in vicinity of the source when 0V is applied to said well of the first conductive type and the drain of said second semiconductor layer, thereby to increase a threshold voltage of said memory cell, and the verification of said program data is conducted by applying a verify voltage to said second gate, while applying a positive voltage to the drain of said second semiconductor layer and 0V to said well of the first conductive type and the source of said second conductor layer, thereby verifying whether the positive voltage applied to the drain of said second semiconductor layer is maintained as it is or comes down to 0V, depending upon a height of the threshold voltage of said memory cell, by means of said discrimination circuit.

(8) The nonvolatile semiconductor memory device, as described in the above (7), wherein said discrimination circuit is constructed by a verify circuit of flip-flop type, a first MOS transistor for connecting said verify circuit and said bit line in series, and a plural number of MOS transistor groups for converting the data which is verified by said verify circuit, so as to transfer them to said bit line, wherein said first MOS transistor is constructed with a N-type MOS transistor, said MOS transistor group 1 is constructed with a second N-type MOS transistor and a third N-type MOS transistor which are connected in series, and wherein, a gate of said first MOS transistor is connected to a first signal line, a source of said second N-type MOS transistor to said bit line, a source of said third N-type MOS transistor to an internal supply voltage, a gate of said second N-type MOS transistor to a second signal line, and a gate of said third N-type MOS transistor to an output node of said verify circuit of flip-flop type, respectively.

(9) A nonvolatile semiconductor memory device, comprising:

a memory cell, having a well of first conductive type formed on a main surface of a semiconductor substrate, a second semiconductor source/drain diffusion layer region, formed along with a fist direction within said well, a first gate formed on said semiconductor substrate through a first insulator film, a second gate formed on said first gate through a second insulator film, and a third gate formed through said first gate and a third insulator film, wherein said third gate is formed extending in said one direction, thereby being formed to be buried in a space of said first gate;

a word line control circuit for driving a word line connected to said second gate;

an assist gate control circuit for driving said third gate;

a program data holding circuit, being able to hold a program data of N bits;

a programming voltage generator circuit for applying programming voltage onto a bit line, which is connected to a drain of said second semiconductor source/drain diffusion layer region; and a discrimination circuit for verifying said programmed data, wherein programming of data to said memory cell is conducted by applying positive independent voltages to said second gate and the drain of said second semiconductor layer, respectively, while injecting hot electron generating in a channel portion in vicinity of the drain when 0V is applied to said well of the first conductive type and the source of said second semiconductor layer, thereby to increase a threshold voltage of said memory cell, and the verification of said program data is conducted by applying a verify voltage to said second gate, while applying a positive voltage to the drain of said second semiconductor layer and 0V to said well of the first conductive type and the source of said second conductor layer, thereby verifying whether the positive voltage applied to the drain of said second semiconductor layer is maintained as it is or comes down to 0V, depending upon a height of the threshold voltage of said memory cell, by means of said discrimination circuit.

(10) The nonvolatile semiconductor memory device, as described in the above (9), wherein said discrimination circuit is constructed by a verify circuit of flip-flop type, a first MOS transistor for connecting said verify circuit and said bit line in series, and a plural number of MOS transistor groups for converting the data which is verified by said verify circuit, so as to transfer them to said bit line, wherein the verified data is inverted at least one (1) time in a series of operations of said programming and verification.

(11) The nonvolatile semiconductor memory device, as described in the above (10), wherein said first MOS transistor is constructed with a N-type MOS transistor, said MOS transistor group 1 is constructed with a second N-type MOS transistor and a third N-type MOS transistor which are connected in series, wherein a gate of said first MOS transistor is connected a first signal line, a source of said second N-type MOS transistor to said bit line, a source of said third N-type MOS transistor to an internal supply voltage, a gate of said second N-type MOS transistor to a second signal line, and a gate of said third N-type MOS transistor to a first or second output node of said verify circuit of flip-flop type, respectively.

(12) The nonvolatile semiconductor memory device, as described in the above (10), wherein said first MOS transistor is constructed with a N-type MOS transistor, said MOS transistor group 1 is constructed with a second N-type MOS transistor and a P-type MOS transistor which are connected in series, wherein a gate of said first MOS transistor is connected a first signal line, a source of said second N-type MOS transistor to said bit line, a source of said P-type MOS transistor to an internal supply voltage, a gate of said second N-type MOS transistor to a second signal line, and a gate of said P-type MOS transistor to a first or second output node of said verify circuit of flip-flop type, respectively.

(13) The nonvolatile semiconductor memory device, as described in the above (9), wherein said discrimination circuit is constructed by a verify circuit of flip-flop type, a first MOS transistor for connecting said verify circuit and said bit line in series, and a plural number of MOS transistor groups for converting the data which is verified by said verify circuit, so as to transfer them to said bit line, wherein said first MOS transistor is constructed with a N-type MOS transistor, said MOS transistor group 1 is constructed with a MOS transistor group 2 comprising a second N-type MOS transistor and a third N-type MOS transistor which are connected in series, and a MOS transistor group 3 comprising a fourth N-type MOS transistor and a P-type MOS transistor which are connected in series, and wherein, a gate of said first MOS transistor is connected to a first signal line, sources of said second N-type MOS transistor and said fourth N-type MOS transistor to said bit line, a source of said third N-type MOS transistor to an internal supply voltage, a source of said P-type MOS transistor to a second internal supply voltage, a gate of said second N-type MOS transistor to a second signal line, a gate of said fourth N-type MOS transistor to a third signal line, and gates of said third N-type MOS transistor and said P-type MOS transistor to an output node of said verify circuit of flip-flop type, respectively.

(14) The nonvolatile semiconductor memory device, as described in the above (9), wherein said discrimination circuit is constructed with a verify circuit of flip-flop type, a first MOS transistor for connecting said verify circuit and said bit line in series, and a plural number of MOS transistor groups for converting the data on the bit line, so as to transfer them to said verify circuit of flip-flop type, wherein said first MOS transistor is constructed with a N-type MOS transistor, said MOS transistor group 1 is constructed with a second N-type MOS transistor and a third N-type MOS transistor which are connected in series, and wherein a gate of said first MOS transistor is connected to a first signal line, a source of said second N-type MOS transistor to an output node of said verify circuit of flip-flop type, a source of said third N-type MOS transistor to an internal supply voltage, and a gate of said second N-type MOS transistor to said bit line, respectively.

(15) A nonvolatile semiconductor memory device, comprising:

a memory cell, having a well of first conductive type formed on a main surface of a semiconductor substrate, a second semiconductor source/drain diffusion layer region, formed along with a fist direction within said well, a first gate formed on said semiconductor substrate through a first insulator film, a second gate formed on said first gate through a second insulator film, and a third gate formed through said first gate and a third insulator film, wherein said third gate is formed extending in said one direction, thereby being formed to be buried in a space of said first gate;

a word line control circuit for driving a word line connected to said second gate;

an assist gate control circuit for driving said third gate;

a program data holding circuit, being able to hold a program data of N bits;

a programming prevent voltage generator circuit for applying programming prevent voltage onto a bit line, which is connected to a drain of said second semiconductor source/drain diffusion layer region; and a discrimination circuit for verifying said programmed data, wherein programming of data to said memory cell is conducted by applying positive independent voltages to said second gate and the drain of said second semiconductor layer, respectively, while injecting hot electron generating in a channel portion in vicinity of the source when 0V is applied to said well of the first conductive type and the drain of said second semiconductor layer, thereby to increase a threshold voltage of said memory cell, and the verification of said program data is conducted by applying a verify voltage to said second gate, while applying a positive voltage to the drain of said second semiconductor layer and 0V to said well of the first conductive type and the source of said second conductor layer, thereby verifying whether the positive voltage applied to the drain of said second semiconductor layer is maintained as it is or comes down to 0V, depending upon a height of the threshold voltage of said memory cell, by means of said discrimination circuit.

(16) The nonvolatile semiconductor memory device, as described in the above (15), wherein said decision circuit is constructed by a verify circuit of flip-flop type, a first MOS transistor for connecting said verify circuit and said bit line in series, and a plural number of MOS transistor groups for converting the data which is verified by said verify circuit, so as to transfer them to said bit line, wherein said first MOS transistor is constructed with a N-type MOS transistor, said MOS transistor group 1 is constructed with a second N-type MOS transistor and a third N-type MOS transistor which are connected in series, and wherein, a gate of said first MOS transistor is connected to a first signal line, a source of said second N-type MOS transistor to said bit line, a source of said third N-type MOS transistor to an internal supply voltage, a gate of said second N-type MOS transistor to a second signal line, and a gate of said third N-type MOS transistor to an output node of said verify circuit of flip-flop type, respectively.

Effects obtained by representative ones of the present invention, which is disclosed in the present application, are as follows:

It is possible to operate the nonvolatile semiconductor memory device with a low electric power; and It is also possible to operate the nonvolatile semiconductor memory device at a high speed.

What is claimed is:

1. A nonvolatile semiconductor memory device, comprising:

a memory cell, including a source layer formed in a semiconductor substrate, a drain layer formed in said semiconductor substrate and apart from said source layer, a floating gate formed above a portion of said semiconductor substrate between said source layer and said drain layer, and a control gate formed above said floating gate;

a word line control circuit to drive a word line connected to said control gate;

a program data holding circuit to hold program data;

a programming voltage generator circuit to apply a programming voltage to a bit line connected to said drain layer; and a discrimination circuit to verify said program data, wherein programming of said programming data to said memory cell is conducted by injecting hot electrons generated between said source layer and said drain layer into said floating gate, and wherein verification of said programmed data is conducted by the following steps:

(a) charging a pre-charge voltage to said bit line;

(b) making said bit line a floating state, after step (a);

(c) applying a verify voltage to said word line, after the step (b); and (d) discriminating whether said pre-charge voltage is retained or not, depending upon a height of a threshold voltage of said memory cell, after step (c).

2. The nonvolatile semiconductor memory device, according to claim 1, wherein said discrimination circuit has a verify circuit of a flip-flop type, an insulated-gate type transistor provided between an output node of said verify circuit and said bit line for connecting therebetween, and a circuit formed with a plural number of insulated gate-type transistor groups to convert data verified by said verify circuit, so as to transfer said data to said bit line, wherein the verified data is inverted at least one time in a series of operations of said programming and verification.

3. A nonvolatile semiconductor memory device, according to claim 1, wherein said semiconductor source layer and said drain layer are each formed of a diffusion layer.

* * * * *